(12) United States Patent
Huemoeller et al.

(10) Patent No.: US 7,977,163 B1
(45) Date of Patent: *Jul. 12, 2011

(54) EMBEDDED ELECTRONIC COMPONENT PACKAGE FABRICATION METHOD

(75) Inventors: Ronald P. Huemoeller, Chandler, AZ (US); Sukianto Rusli, Phoenix, AZ (US); David Jon Hiner, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/459,532

(22) Filed: Jul. 2, 2009

Related U.S. Application Data

(62) Division of application No. 11/298,016, filed on Dec. 8, 2005, now Pat. No. 7,572,681.

(51) Int. Cl.
*H01L 21/00* (2006.01)

(52) U.S. Cl. .. 438/125; 257/773; 257/787; 257/E23.067

(58) Field of Classification Search .................. 257/667, 257/678, 700, 773, 787, E23.067; 438/121, 438/122, 125, 127
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,781,596 A | 12/1973 | Galli et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |

(Continued)

FOREIGN PATENT DOCUMENTS

DE 197 34 794 7/1998

(Continued)

OTHER PUBLICATIONS

Kim et al., "Application of Through Mold Via (TMV) as PoP base package", *58th ECTC Proceedings*, May 2008, Lake Buena Vista, FL, 6 pages, IEEE.

(Continued)

*Primary Examiner* — Thao X Le
*Assistant Examiner* — William F Kraig
(74) *Attorney, Agent, or Firm* — Gunnison, McKay & Hodgson, L.L.P.; Serge J. Hodgson

(57) ABSTRACT

A method of forming an embedded electronic component package includes coupling a substrate to a first dielectric layer, strip, or panel, and forming first electrically conductive vias and traces in the first dielectric layer. A cavity is then formed in the first dielectric layer and an electronic component is attached in the cavity. A second dielectric layer, strip, or panel, is then applied to the first dielectric layer, thereby encasing the electronic component in dielectric. Second via apertures are then formed through the second dielectric layer to expose selected electronic component bond pads and/or selected first electrically conductive vias and traces. The second via apertures are then filled with an electrically conductive material to form second electrically conductive vias electrically coupled to selected bond pads and selected first electrically conductive vias and traces.

18 Claims, 20 Drawing Sheets

U.S. PATENT DOCUMENTS

| | | |
|---|---|---|
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,250,843 A | 10/1993 | Eichelberger |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,303 A | 2/1995 | Yamaji |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A * | 7/1995 | Mowatt et al. ................ 361/719 |
| 5,435,057 A | 7/1995 | Bindra et al. |
| 5,444,301 A | 8/1995 | Song et al. |
| 5,452,511 A | 9/1995 | Chang |
| 5,454,904 A | 10/1995 | Ghezzo et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,497,033 A | 3/1996 | Fillion et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,576,517 A | 11/1996 | Wojnarowski et al. |
| 5,578,525 A | 11/1996 | Mizukoshi |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,619,068 A | 4/1997 | Benzoni |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,776,798 A | 7/1998 | Quan et al. |
| 5,783,861 A | 7/1998 | Son |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger |
| 5,844,306 A | 12/1998 | Fujita et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |

| | | | |
|---|---|---|---|
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,909,053 A | 6/1999 | Fukase et al. | |
| 5,915,998 A | 6/1999 | Stidham et al. | |
| 5,917,242 A | 6/1999 | Ball | |
| 5,937,324 A | 8/1999 | Abercrombie et al. | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,969,426 A | 10/1999 | Baba et al. | |
| 5,973,388 A | 10/1999 | Chew et al. | |
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,982,632 A | 11/1999 | Mosley et al. | |
| 5,986,333 A | 11/1999 | Nakamura | |
| 5,986,885 A | 11/1999 | Wyland | |
| 6,001,671 A | 12/1999 | Fjelstad | |
| 6,013,947 A | 1/2000 | Lim | |
| 6,018,189 A | 1/2000 | Mizuno | |
| 6,020,625 A | 2/2000 | Qin et al. | |
| 6,025,640 A | 2/2000 | Yagi et al. | |
| 6,031,279 A | 2/2000 | Lenz | |
| RE36,613 E | 3/2000 | Ball | |
| 6,034,423 A | 3/2000 | Mostafazadeh et al. | |
| 6,040,626 A | 3/2000 | Cheah et al. | |
| 6,043,430 A | 3/2000 | Chun | |
| 6,060,768 A | 5/2000 | Hayashida et al. | |
| 6,060,769 A | 5/2000 | Wark | |
| 6,072,228 A | 6/2000 | Hinkle et al. | |
| 6,075,284 A | 6/2000 | Choi et al. | |
| 6,081,029 A | 6/2000 | Yamaguchi | |
| 6,084,310 A | 7/2000 | Mizuno et al. | |
| 6,087,715 A | 7/2000 | Sawada et al. | |
| 6,087,722 A | 7/2000 | Lee et al. | |
| 6,097,089 A | 8/2000 | Gaku et al. | |
| 6,100,594 A | 8/2000 | Fukui et al. | |
| 6,113,474 A | 9/2000 | Shih et al. | |
| 6,114,752 A | 9/2000 | Huang et al. | |
| 6,118,174 A | 9/2000 | Kim | |
| 6,118,184 A | 9/2000 | Ishio et al. | |
| RE36,907 E | 10/2000 | Templeton, Jr. et al. | |
| 6,127,633 A * | 10/2000 | Kinoshita | 174/259 |
| 6,130,115 A | 10/2000 | Okumura et al. | |
| 6,130,473 A | 10/2000 | Mostafazadeh et al. | |
| 6,133,623 A | 10/2000 | Otsuki et al. | |
| 6,140,154 A | 10/2000 | Hinkle et al. | |
| 6,143,981 A | 11/2000 | Glenn | |
| 6,154,366 A * | 11/2000 | Ma et al. | 361/704 |
| 6,159,767 A | 12/2000 | Eichelberger | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |
| 6,194,250 B1 | 2/2001 | Melton et al. | |
| 6,194,777 B1 | 2/2001 | Abbott et al. | |
| 6,197,615 B1 | 3/2001 | Song et al. | |
| 6,198,171 B1 | 3/2001 | Huang et al. | |
| 6,201,186 B1 | 3/2001 | Daniels et al. | |
| 6,201,292 B1 | 3/2001 | Yagi et al. | |
| 6,204,554 B1 | 3/2001 | Ewer et al. | |
| 6,208,020 B1 | 3/2001 | Minamio et al. | |
| 6,208,021 B1 | 3/2001 | Ohuchi et al. | |
| 6,208,023 B1 | 3/2001 | Nakayama et al. | |
| 6,211,462 B1 | 4/2001 | Carter, Jr. et al. | |
| 6,214,525 B1 | 4/2001 | Boyko et al. | |
| 6,217,987 B1 | 4/2001 | Ono et al. | |
| 6,218,731 B1 | 4/2001 | Huang et al. | |
| 6,221,754 B1 * | 4/2001 | Chiou et al. | 438/619 |
| 6,222,258 B1 | 4/2001 | Asano et al. | |
| 6,222,259 B1 | 4/2001 | Park et al. | |
| 6,225,146 B1 | 5/2001 | Yamaguchi et al. | |
| 6,229,200 B1 | 5/2001 | Mclellan et al. | |
| 6,229,205 B1 | 5/2001 | Jeong et al. | |
| 6,239,367 B1 | 5/2001 | Hsuan et al. | |
| 6,239,384 B1 | 5/2001 | Smith et al. | |
| 6,242,281 B1 | 6/2001 | Mclellan et al. | |
| 6,256,200 B1 | 7/2001 | Lam et al. | |
| 6,258,192 B1 | 7/2001 | Natarajan | |
| 6,258,629 B1 | 7/2001 | Niones et al. | |
| 6,261,918 B1 | 7/2001 | So | |
| 6,281,566 B1 | 8/2001 | Magni | |
| 6,281,568 B1 | 8/2001 | Glenn et al. | |
| 6,282,095 B1 | 8/2001 | Houghton et al. | |
| 6,285,075 B1 | 9/2001 | Combs et al. | |
| 6,291,271 B1 | 9/2001 | Lee et al. | |
| 6,291,273 B1 | 9/2001 | Miyaki et al. | |
| 6,294,100 B1 | 9/2001 | Fan et al. | |
| 6,294,830 B1 | 9/2001 | Fjelstad | |
| 6,295,977 B1 | 10/2001 | Ripper et al. | |
| 6,297,548 B1 | 10/2001 | Moden et al. | |
| 6,303,984 B1 | 10/2001 | Corisis | |
| 6,303,997 B1 | 10/2001 | Lee | |
| 6,307,272 B1 | 10/2001 | Takahashi et al. | |
| 6,309,909 B1 | 10/2001 | Ohgiyama | |
| 6,316,822 B1 | 11/2001 | Venkateshwaran et al. | |
| 6,316,838 B1 | 11/2001 | Ozawa et al. | |
| 6,323,550 B1 | 11/2001 | Martin et al. | |
| 6,326,243 B1 | 12/2001 | Suzuya et al. | |
| 6,326,244 B1 | 12/2001 | Brooks et al. | |
| 6,326,678 B1 | 12/2001 | Karnezos et al. | |
| 6,335,564 B1 | 1/2002 | Pour | |
| 6,337,510 B1 | 1/2002 | Chun-Jen et al. | |
| 6,339,255 B1 | 1/2002 | Shin | |
| 6,348,726 B1 | 2/2002 | Bayan et al. | |
| 6,355,502 B1 | 3/2002 | Kang et al. | |
| 6,365,974 B1 | 4/2002 | Abbott et al. | |
| 6,369,447 B2 | 4/2002 | Mori | |
| 6,369,454 B1 | 4/2002 | Chung | |
| 6,373,127 B1 | 4/2002 | Baudouin et al. | |
| 6,380,048 B1 | 4/2002 | Boon et al. | |
| 6,384,472 B1 | 5/2002 | Huang | |
| 6,388,336 B1 | 5/2002 | Venkateshwaran et al. | |
| 6,395,578 B1 | 5/2002 | Shin et al. | |
| 6,396,148 B1 | 5/2002 | Eichelberger et al. | |
| 6,396,153 B2 | 5/2002 | Fillion et al. | |
| 6,400,004 B1 | 6/2002 | Fan et al. | |
| 6,410,979 B2 | 6/2002 | Abe | |
| 6,414,385 B1 | 7/2002 | Huang et al. | |
| 6,418,615 B1 | 7/2002 | Rokugawa et al. | |
| 6,420,779 B1 | 7/2002 | Sharma et al. | |
| 6,429,508 B1 | 8/2002 | Gang | |
| 6,437,429 B1 | 8/2002 | Su et al. | |
| 6,444,499 B1 | 9/2002 | Swiss et al. | |
| 6,448,633 B1 | 9/2002 | Yee et al. | |
| 6,452,279 B2 | 9/2002 | Shimoda | |
| 6,459,148 B1 | 10/2002 | Chun-Jen et al. | |
| 6,464,121 B2 | 10/2002 | Reijnders | |
| 6,476,469 B2 | 11/2002 | Hung et al. | |
| 6,476,474 B1 | 11/2002 | Hung | |
| 6,482,680 B1 | 11/2002 | Khor et al. | |
| 6,486,005 B1 | 11/2002 | Kim | |
| 6,498,099 B1 | 12/2002 | McLellan et al. | |
| 6,498,392 B2 | 12/2002 | Azuma | |
| 6,507,096 B2 | 1/2003 | Gang | |
| 6,507,120 B2 | 1/2003 | Lo et al. | |
| 6,521,530 B2 | 2/2003 | Peters et al. | |
| 6,524,885 B2 | 2/2003 | Pierce | |
| 6,534,849 B1 | 3/2003 | Gang | |
| 6,545,332 B2 | 4/2003 | Huang | |
| 6,545,345 B1 | 4/2003 | Glenn et al. | |
| 6,548,898 B2 | 4/2003 | Matsuki et al. | |
| 6,549,891 B1 | 4/2003 | Rauber et al. | |
| 6,559,525 B2 | 5/2003 | Huang | |
| 6,566,168 B2 | 5/2003 | Gang | |
| 6,583,503 B2 | 6/2003 | Akram et al. | |
| 6,593,645 B2 | 7/2003 | Shih et al. | |
| 6,603,196 B2 | 8/2003 | Lee et al. | |
| 6,624,005 B1 | 9/2003 | DiCaprio et al. | |
| 6,667,546 B2 | 12/2003 | Huang et al. | |
| 6,671,398 B2 | 12/2003 | Reinhorn et al. | |
| 6,680,529 B2 * | 1/2004 | Chen et al. | 257/700 |

| | | |
|---|---|---|
| 6,727,576 B2 | 4/2004 | Hedler et al. |
| 6,730,857 B2 | 5/2004 | Konrad et al. |
| 6,740,964 B2 | 5/2004 | Sasaki |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,060 B1 | 2/2005 | Seok et al. |
| 6,905,914 B1 * | 6/2005 | Huemoeller et al. ......... 438/118 |
| 6,919,514 B2 | 7/2005 | Konrad et al. |
| 6,921,975 B2 | 7/2005 | Leal et al. |
| 6,930,256 B1 | 8/2005 | Huemoeller et al. |
| 7,015,075 B2 | 3/2006 | Fay et al. |
| 7,041,534 B2 | 5/2006 | Chao et al. |
| 7,129,158 B2 | 10/2006 | Nakai |
| 7,190,062 B1 | 3/2007 | Sheridan et al. |
| 7,192,807 B1 | 3/2007 | Huemoeller et al. |
| 7,196,408 B2 | 3/2007 | Yang et al. |
| 7,202,107 B2 | 4/2007 | Fuergut et al. |
| 7,238,602 B2 | 7/2007 | Yang |
| 7,242,081 B1 | 7/2007 | Lee |
| 7,247,523 B1 | 7/2007 | Huemoeller et al. |
| 7,262,081 B2 | 8/2007 | Yang et al. |
| 7,272,444 B2 | 9/2007 | Peterson et al. |
| 7,326,592 B2 | 2/2008 | Meyer et al. |
| 7,339,279 B2 | 3/2008 | Yang |
| 7,345,361 B2 | 3/2008 | Mallik et al. |
| 7,361,533 B1 | 4/2008 | Huemoeller et al. |
| 7,361,987 B2 | 4/2008 | Leal et al. |
| 7,372,151 B1 | 5/2008 | Fan et al. |
| 7,405,102 B2 | 7/2008 | Lee et al. |
| 7,405,484 B2 | 7/2008 | Usui et al. |
| 7,408,261 B2 | 8/2008 | Yoon et al. |
| 7,420,272 B1 | 9/2008 | Huemoeller et al. |
| 7,459,781 B2 | 12/2008 | Yang et al. |
| 7,692,286 B1 | 4/2010 | Huemoeller et al. |
| 7,714,431 B1 | 5/2010 | Huemoeller et al. |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0024122 A1 | 2/2002 | Jung et al. |
| 2002/0027297 A1 | 3/2002 | Ikenaga et al. |
| 2002/0061642 A1 | 5/2002 | Haji et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0064548 A1 | 4/2003 | Isaak |
| 2003/0073265 A1 | 4/2003 | Hu et al. |
| 2003/0134455 A1 * | 7/2003 | Cheng et al. ......... 438/125 |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2005/0001309 A1 | 1/2005 | Tanaka et al. |
| 2005/0124093 A1 * | 6/2005 | Yang et al. ......... 438/110 |
| 2005/0242425 A1 | 11/2005 | Leal et al. |
| 2005/0266608 A1 | 12/2005 | Ho et al. |
| 2005/0282314 A1 | 12/2005 | Lo et al. |
| 2006/0145343 A1 | 7/2006 | Lee et al. |
| 2006/0192301 A1 | 8/2006 | Leal et al. |
| 2006/0209497 A1 | 9/2006 | Ooi et al. |
| 2006/0225918 A1 | 10/2006 | Chinda et al. |
| 2006/0231958 A1 | 10/2006 | Yang |
| 2006/0243478 A1 | 11/2006 | Inagaki et al. |
| 2006/0284309 A1 | 12/2006 | Park et al. |
| 2007/0059866 A1 | 3/2007 | Yang et al. |
| 2007/0273049 A1 | 11/2007 | Khan et al. |
| 2007/0290376 A1 | 12/2007 | Zhao et al. |
| 2008/0105967 A1 | 5/2008 | Yang et al. |
| 2008/0128884 A1 | 6/2008 | Meyer et al. |
| 2008/0142960 A1 | 6/2008 | Leal et al. |
| 2008/0182363 A1 | 7/2008 | Amrine et al. |
| 2008/0230887 A1 | 9/2008 | Sun et al. |
| 2009/0051025 A1 | 2/2009 | Yang et al. |

FOREIGN PATENT DOCUMENTS

| | | |
|---|---|---|
| EP | 0 393 997 | 10/1990 |
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2001-118947 | 4/2001 |
| JP | 2002-043497 | 2/2002 |
| KR | 1994-0001979 | 1/1994 |
| KR | 10-0220154 | 6/1999 |
| KR | 2002-0049944 | 6/2002 |
| KR | 2004-0012028 | 2/2004 |
| WO | WO 99/56316 | 11/1999 |
| WO | WO 99/67821 | 12/1999 |

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Huemoeller et al., "Embedded Electronic Component Package", U.S. Appl. No. 11/298,016, filed Dec. 8, 2005.

Lee et al., "Substrate for Semiconductor Device and Manufacturing Method Thereof", U.S. Appl. No. 11/440,548, filed May 24, 2006.

Huemoeller et al., "Electronic Component Package Comprising Fan-out and Fan-in Traces", U.S. Appl. No. 11/605,740, filed Nov. 28, 2006.

Berry et al., "Direct-write Wafer Level Chip Scale Package", U.S. Appl. No. 11/810,799, filed Jun. 6, 2007.

Berry et al., "Thin Stacked Interposer Package", U.S. Appl. No. 11/865,617, filed Oct. 1, 2007.

Huemoeller et al., "Two-sided Fan-out Wafer Escape Package", U.S. Appl. No. 12/221,797, filed Aug. 5, 2008.

Berry et al., "Direct-Write Wafer Level Chip Scale Package", U.S. Appl. No. 11/289,826, filed Nov. 29, 2005.

Berry et al., "Direct-Write Wafer Level Chip Scale Package", U.S. Appl. No. 12/661,597, filed Mar. 19, 2010.

Huemoeller et al., "Electronic Component Package Comprising Fan-Out Traces", U.S. Appl. No. 12/661,604, filed Mar. 19, 2010.

\* cited by examiner

EMBEDDED ELECTRONIC COMPONENT PACKAGE FABRICATION METHOD

RELATED APPLICATIONS

The present Application is a divisional of Huemoeller et al., U.S. patent application Ser. No. 11/298,016, entitled "EMBEDDED ELECTRONIC COMPONENT PACKAGE" filed Dec. 8, 2005, which is herein incorporated by reference in its entirety.

BACKGROUND OF THE INVENTION

1. Field of the Invention

The present invention relates generally to the packaging of electronic components. More particularly, the present invention relates to an embedded electronic component package and method of fabricating the same.

2. Description of Related Art

One form of an electronic component package included an electronic component such as an integrated circuit chip mounted to a substrate. For example, in a wirebond configuration, the rear surface of the integrated circuit chip was mounted to the substrate, e.g., with an adhesive. Bond wires were used to form the electrical interconnections between the bond pads on the front surface of the integrated circuit chip and the electrically conductive traces on the substrate.

As the art moved to smaller and lighter weight electronic devices, it became increasingly important that the size of the electronic component package used within these electronic devices be as small as possible. However, in the wirebond configuration described above, the traces of the substrate were fanned out around the integrated circuit chip, which placed a fundamental restriction on the minimum electronic component package size. Further, a large impedance was associated with the bond wires.

To allow a further reduction in the electronic component package size as well as to reduce impedance of the interconnections, a flip chip configuration was used instead of a wirebond configuration. In a flip chip configuration, the bond pads on the front surface of the integrated circuit chip were directly connected to the traces on the substrate with flip chip bumps, e.g., solder. This avoided the need to fan out the traces around the integrated circuit chip resulting in a minimum package size. Further, the use of flip chip bumps between the bond pads and the traces on the substrate minimized impedance.

However, the flip chip bumps between the bond pads of the integrated circuit chip and the traces on the substrate were subject to significant stress, e.g., due to differential thermal expansion between the integrated circuit chip and the substrate. Thus, failure of the flip chip bumps often occurred which, in turn, decreased yield and increased the cost of the electronic component package.

To minimize the failure of the flip chip bumps, an underfill material was often applied between the integrated circuit chip and the substrate and around the flip chip bumps. However, the application of the underfill material required an additional manufacturing step and materials, which increased the cost of the electronic component package.

In addition, prior art packages typically were mounted to a substrate, such as a motherboard, such that the entire electronic component, and or package, was situated above the surface of the substrate. Consequently, the electronic connections to the substrate, and the electronic component itself, were extremely vulnerable to stress and breakage.

In addition, the prior art mounting to a substrate, such as a motherboard, with the entire electronic component, and or package, situated above the surface of the substrate meant precious substrate surface area was wasted and the resulting device was larger than ideal.

SUMMARY OF THE INVENTION

In accordance with one embodiment of the present invention, a method of forming an electronic component package includes coupling a first surface of an electronic component to a first surface of a first dielectric strip, the electronic component comprising bond pads on the first surface; forming first via apertures through the first dielectric strip to expose the bond pads; and filling the first via apertures with an electrically conductive material to form first vias electrically coupled to the bond pads.

Thus, in accordance with this embodiment of the present invention, the bond pads are directly connected to the corresponding first vias. Stated another way, the bond pads are electrically connected to the corresponding first vias without the use of a solder, e.g., without the use of flip chip bumps, and without the need to form a solder wetting layer, e.g., a nickel/gold layer, on the bond pads. This maximizes the reliability of the electrical connection between the first vias and the bond pads, while at the same time minimizes impedance.

Further, since the dielectric strip is directly attached to the electronic component and the bond pads are directly connected to the corresponding first vias, the use of an underfill material is obviated. This simplifies manufacturing, enhances reliability, and thus reduces cost.

In one embodiment of the present invention, a method of forming an embedded electronic component package includes coupling a first surface of a substrate, such as a motherboard, to a second surface of a first dielectric layer, strip, or panel. Then the method and structure of this embodiment of the invention includes forming first via apertures and trace trenches through the first dielectric layer, to expose selected locations on the substrate first surface, and filling the first via apertures and trace trenches with an electrically conductive material to form first electrically conductive vias and traces.

According to this embodiment of the invention, a cavity is then formed in the first surface of the first dielectric layer. An electronic component, such as an integrated circuit, active component, or passive component, is then attached to a bottom surface of the cavity, with a first surface of the electronic component, including bond pads, being either level with, partially below, or partially above the first surface of the first dielectric layer. Once the electronic component is situated in the cavity, a second dielectric layer is applied to the first dielectric layer, thereby encasing the electronic component in dielectric. Then the method and structure of this embodiment of the invention includes forming second via apertures through the second dielectric layer to expose the bond pads and/or the first electrically conductive vias and traces; and filling the second via apertures with an electrically conductive material to form second electrically conductive vias electrically coupled to the bond pads and first electrically conductive vias and traces.

In another embodiment of the invention the first surface of an electronic component is attached to a first surface of a first dielectric strip and then the cavity is formed around the electronic component by laminating two or more layers of a dielectric, such as prepreg material, around and over the electronic component and then curing the dielectric material to encase the electronic component.

Thus, in accordance with these embodiments of the present invention, the electronic component is encased in dielectric material. Consequently, the electronic connections to the substrate, and the electronic component itself, are protected and less vulnerable to stress and breakage than prior art systems. In addition, in the one embodiment with the electronic component encased in dielectric material at least partially below the first surface of the first dielectric layer, in accordance with the present invention, surface area is no longer wasted and the resulting device can be made smaller than prior art devices.

According to this embedded electronic component embodiment of the invention, the bond pads and first electrically conductive vias and traces are directly connected to the corresponding second electrically conductive vias. Stated another way, the bond pads and first electrically conductive vias and traces are electrically connected to the corresponding second electrically conductive vias, and the first surface of the second dielectric layer, without the use of a solder, e.g., without the use of flip chip bumps, and without the need to form a solder wetting layer, e.g., a nickel/gold layer, on the bond pads. This maximizes the reliability of the electrical connection between the second electrically conductive vias, and the first surface of the second dielectric layer, and the bond pads and first electrically conductive vias and traces, while at the same time minimizing impedance and allowing for more direct connections and less routing.

Further, since, according to this embodiment of the invention, the electronic component is virtually encased in dielectric material, and the second dielectric layer is attached directly to the first surface of the electronic component, use of an underfill material is obviated. This simplifies manufacturing, enhances reliability, and thus reduces cost.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 5:
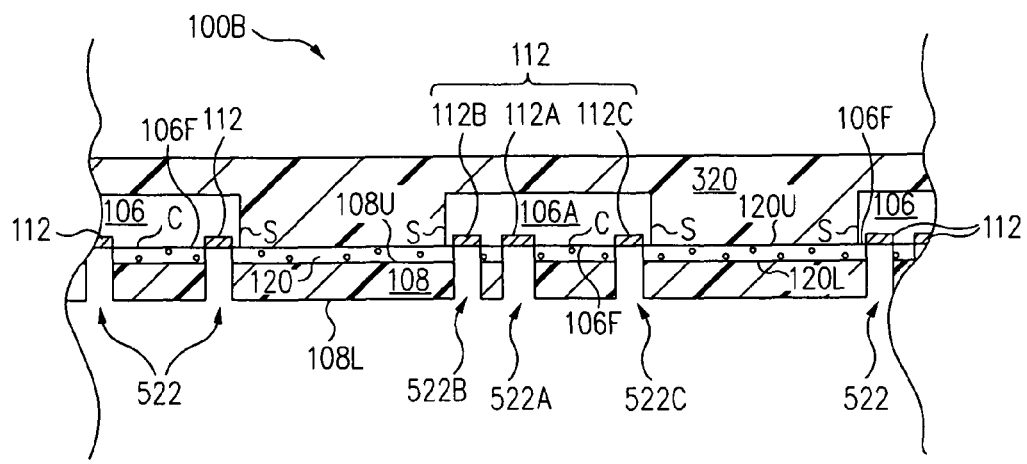
Figure 6:
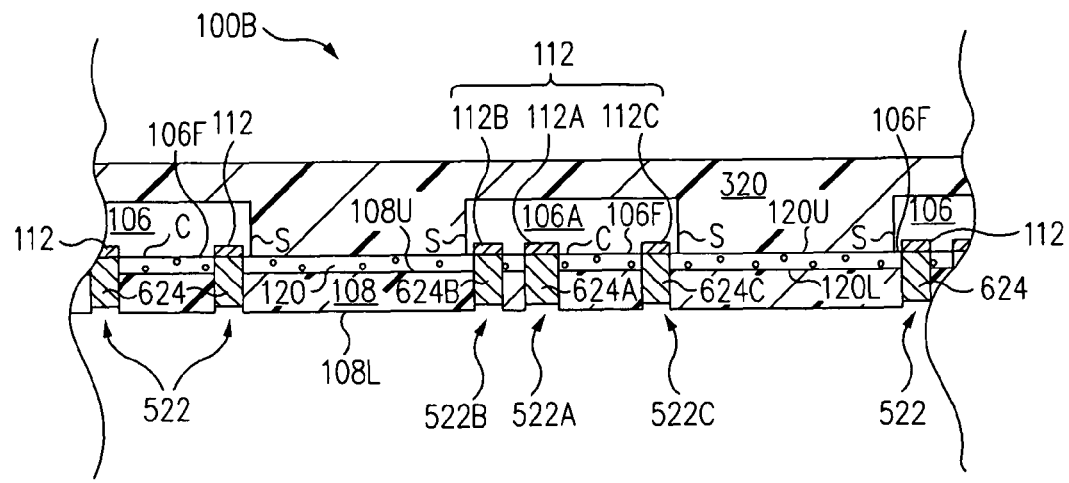

In accordance with one embodiment of the present invention, a method of forming an electronic component package includes coupling first surfaces 106F of electronic components 106 to a first surface 108U of a dielectric strip 108 with adhesives 110 or 120 (FIGS. 1A and 1B), electronic components 106 having bond pads 112 on first surfaces 106F; forming via apertures 522 through dielectric strip 108 to expose bond pads 112 (FIG. 5); and filling via apertures 522 with an electrically conductive material to form vias 624 electrically coupled to bond pads 112 (FIG. 6).

Thus, in accordance with this embodiment of the present invention, bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

Figure 14A:
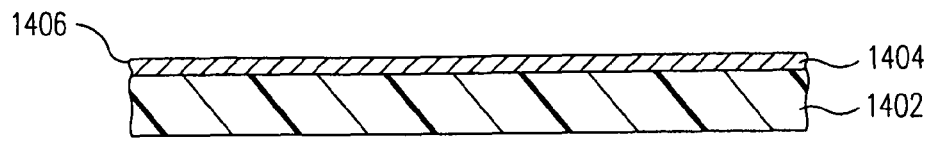
FIG. 14A shows one embodiment of a cross section of an embedded electronic component package sub-assembly in accordance with the principles of the present invention.
Figure 14B:
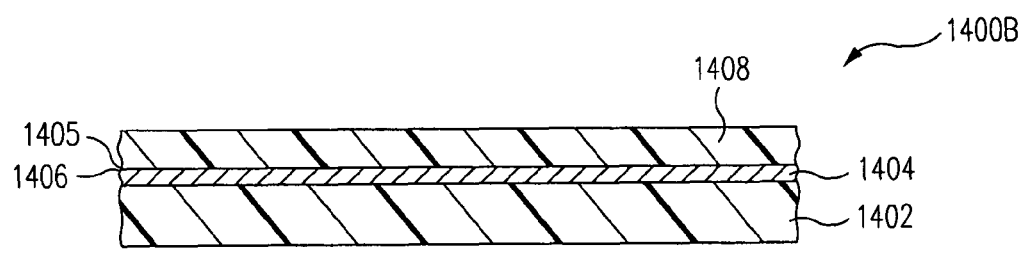
FIG. 14B shows one embodiment of a cross section of the embedded electronic component package sub-assembly of FIG. 14A further in the processing cycle in accordance with the principles of the present invention.

In one embodiment of the present invention, a method of forming an embedded electronic component package includes coupling a first surface (1406 in FIG. 14A) of a substrate (1402 in FIG. 14A), such as a motherboard, to a second surface (1405 in FIG. 14B) of a first dielectric layer, strip, or panel (1408 in FIG. 14B). Then the method and structure of this embodiment of the invention includes forming first via apertures (1422 in FIG. 14C) and trace trenches (1423 in FIG. 14C) through the first dielectric layer, to expose selected locations on the substrate first surface (not shown), and filling the first via apertures and trace trenches with an electrically conductive material to form first electrically conductive vias (1424 in FIG. 14E) and traces (1425 in FIG. 14E).

According to this embodiment of the invention, a cavity (1430 in FIGS. 14F and 14G) is then formed in the first surface of the first dielectric layer. An electronic component (1440 in FIGS. 14H and 14I), such as an integrated circuit, active component, or passive component, is then attached to a bottom surface (1433 in FIG. 14H) of the cavity, with a first surface of the electronic component (1441 in FIGS. 14H and 14I), including bond pads (1445 in FIGS. 14J and 1445A, 1445B, 1445C in FIG. 14K), being either level with, partially below, or partially above the first surface of the first dielectric layer. Once the electronic component is situated in the cavity, a second dielectric layer, strip, or panel (1448 in FIG. 14K) is applied to the first dielectric layer, thereby encasing the electronic component in dielectric. Then the method and structure of this embodiment of the invention includes forming second via apertures (1460A, 1460B, 1460C, 1460D and 1460E in FIG. 14K) through the second dielectric layer to expose the bond pads and/or the first electrically conductive vias and traces; and filling the second via apertures with an electrically conductive material to form second electrically conductive vias (1461A, 1461B, 1461C, 1461D, 1461E in FIG. 14L) electrically coupled to the bond pads and first electrically conductive vias and traces.

Thus, in accordance with this embodiment of the present invention, the electronic component is encased in dielectric material at least partially below the first surface of the first dielectric layer. Consequently, the electronic connections to the substrate, and the electronic component itself, are protected and less vulnerable to stress and breakage than prior art systems. In addition, with the electronic component encased in dielectric material at least partially below the first surface of the first dielectric layer, and below the first surface of the second dielectric layer, in accordance with the present invention, surface area, i.e., area of the first surface of the second dielectric layer is no longer wasted and the resulting device can be made smaller than prior art devices.

According to this embodiment of the invention, the bond pads and first electrically conductive vias and traces are directly connected to the corresponding second electrically conductive vias. Stated another way, the bond pads and first electrically conductive vias and traces are electrically connected to the corresponding second electrically conductive vias, and the first surface of the second dielectric layer, without the use of a solder, e.g., without the use of flip chip bumps, and without the need to form a solder wetting layer, e.g., a nickel/gold layer, on the bond pads. This maximizes the reliability of the electrical connection between the second electrically conductive vias, and the first surface of the second dielectric layer, and the bond pads and first electrically conductive vias and traces, while at the same time minimizing impedance and allowing for more direct connections and less routing.

Further, since, according to this embodiment of the invention, the electronic component is virtually encased in dielectric material, and the second dielectric layer is attached directly to the first surface of the electronic component, use of an underfill material is obviated. This simplifies manufacturing, enhances reliability, and thus reduces cost.

Figure 1A:
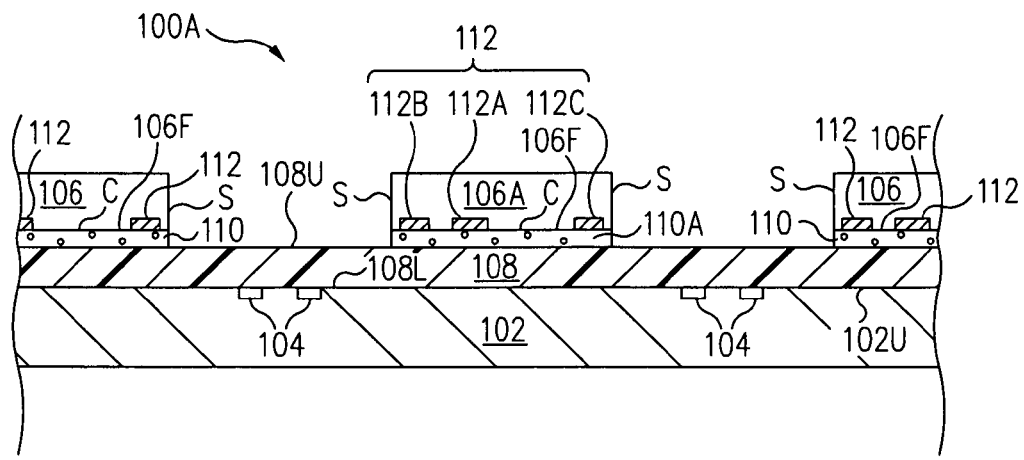
FIG. 1A is a cross-sectional view of an assembly during the fabrication of a plurality of wafer level electronic component packages in accordance with one embodiment of the present invention.

More particularly, FIG. 1A is a cross-sectional view of an assembly 100A during the fabrication of a plurality of wafer level electronic component packages in accordance with one embodiment of the present invention. Referring now to FIG. 1A, assembly 100A includes a rigid support strip 102, e.g., an aluminum, copper or stainless steel plate. Support strip 102 includes fiducials 104 on an upper, e.g., first, surface 102U of support strip 102. Fiducials 104 are used for alignment and mounting of electronic components 106, e.g., integrated circuit chips, as discussed further below.

A dielectric strip 108 is mounted to support strip 102. Electronic components 106 are mounted to dielectric strip 108 with adhesives 110, e.g., liquid adhesives or double-sided sticky tapes, although other adhesives are used in other embodiments. To illustrate, a first electronic component 106A of the plurality of electronic components 106 is mounted to dielectric strip 108 with a first adhesive 110A of the plurality of adhesives 110. Dielectric strip 108, sometimes called a first dielectric strip, and adhesives 110 are electrical insulators, i.e., dielectrics.

More particularly, front, e.g., first, surfaces 106F of electronic components 106 are mounted to an upper, e.g., first, surface 108U of dielectric strip 108 with adhesives 110. A lower, e.g., second, surface 108L of dielectric strip 108 is mounted to upper surface 102U of support strip 102. For example, dielectric strip 108 is tacky, sometimes called sticky, and is simply pressed against support strip 102 to mount dielectric strip 108 to support strip 102.

In one embodiment, adhesives 110 are applied to front surfaces 106F of electronic components 106 while electronic components 106 are still in wafer form, i.e., before they are singulated.

In one embodiment, dielectric strip 108 is transparent such that fiducials 104 are visible through dielectric strip 108. Electronic components 106 are aligned to fiducials 104 and mounted to dielectric strip 108 with adhesives 110, e.g., using an optical alignment system. Adhesives 110 are cured, if necessary.

In one embodiment, electronic components 106 are mounted in a single row on dielectric strip 108. However, in other embodiments, electronic components 106 are mounted in an array on dielectric strip 108. Illustratively, electronic components 106 are mounted in a 2×2, 3×3, ..., or n×m array. In yet another embodiment, only a single electronic component 106 is mounted to dielectric strip 108, i.e., the wafer level electronic component package is fabricated as an individual unit instead of as one of a plurality of units fabricated simultaneously.

Formed on front surface 106F of electronic components 106 are bond pads 112, e.g., formed of aluminum. Bond pads 112 are connected to the internal circuitry of electronic components 106.

In one embodiment, bond pads 112 are distributed in an array on front surface 106F. In another embodiment, bond pads 112 are formed on front surface 106F directly adjacent sides S of electronic components 106 in a typical wirebond configuration pattern.

Figure 1B:
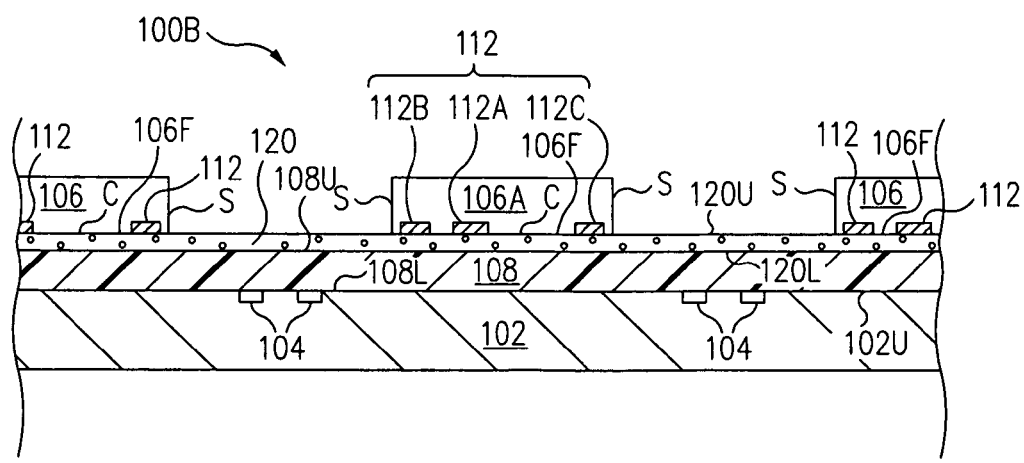
FIG. 1B is a cross-sectional view of an assembly during the fabrication of a plurality of wafer level electronic component packages in accordance with another embodiment of the present invention.

FIG. 1B is a cross-sectional view of an assembly 100B during the fabrication of a plurality of wafer level electronic component packages in accordance with another embodiment of the present invention. Assembly 100B of FIG. 1B is similar to assembly 100A of FIG. 1A and only the significant differences are discussed below.

Referring now to FIGS. 1A and 1B together, instead of mounting electronic components 106 to dielectric strip 108 using individual adhesives 110 as illustrated in FIG. 1A, an adhesive strip 120 (FIG. 1B) is used to mount electronic components 106.

Adhesive strip 120 is an electrical insulator. Illustratively, adhesive strip 120 is a liquid adhesive, for example, applied by spin coating. As another example, adhesive strip 120 is a double-sided sticky tape although other adhesives are used in other embodiments.

More particularly, a lower, e.g., first, surface 120L of adhesive strip 120 is mounted to upper surface 108U of dielectric strip 108. Front surfaces 106F of electronic components 106 are mounted to an upper, e.g., second, surface 120U of adhesive strip 120. Although use of adhesive strip 120 is illustrated in the figures that follow and discussed below for purposes of simplicity, it is to be understood that adhesives 110 (FIG. 1A) are used instead of adhesive strip 120 in an alternative embodiment.

Figure 2:
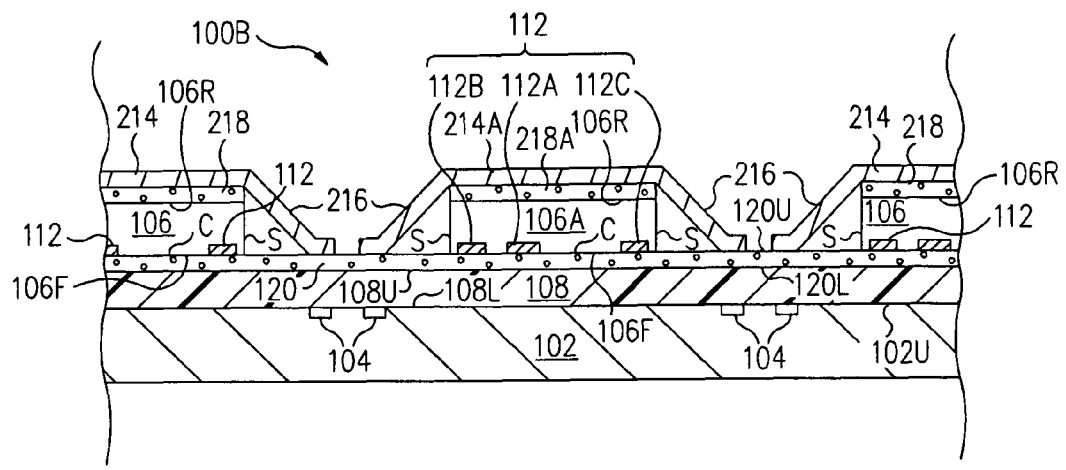
FIGS. 2, 3, 4, 5, 6, 7, 8, 9, 10 and 11 are cross-sectional views of the assembly of FIG. 1B at further stages during the fabrication of a plurality of wafer level electronic component packages in accordance with various embodiments of the present invention.

FIG. 2 is a cross-sectional view of assembly 100B of FIG. 1B at a further stage during the fabrication of a plurality of wafer level electronic component packages in accordance with one embodiment of the present invention. Referring now to FIG. 2, heat sinks 214, e.g., copper slugs, are mounted to rear, e.g., second, surfaces 106R of electronic components 106. During use, heat sinks 214 enhance heat dissipation from electronic components 106 to the ambient environment.

To illustrate, a first heat sink 214A of the plurality of heat sinks 214 is mounted to rear surface 106R of electronic component 106A.

In one embodiment, legs 216 of heat sinks 214 adhere to adhesive strip 120 to hold heat sinks 214 in place. In accordance with one embodiment, a thermal pad or grease is used between heat sinks 214 and rear surfaces 106R of electronic components 106 to enhance heat transfer from electronic components 106 to heat sinks 214.

In another embodiment, adhesives 218, e.g., thermal adhesives having a relatively high heat transfer coefficient, mount heat sinks 214 to rear surface 106R of electronic components 106. To illustrate, heat sink 214A is mounted to rear surface 106R of electronic component 106A with a first adhesive 218A of the plurality of adhesives 218.

Although heat sinks 214 are not illustrated in the figures which follow or discussed further below for purposes of simplicity, it is to be understood that the assembly is fabricated to include heat sinks 214 in an alternative embodiment.

Figure 3:
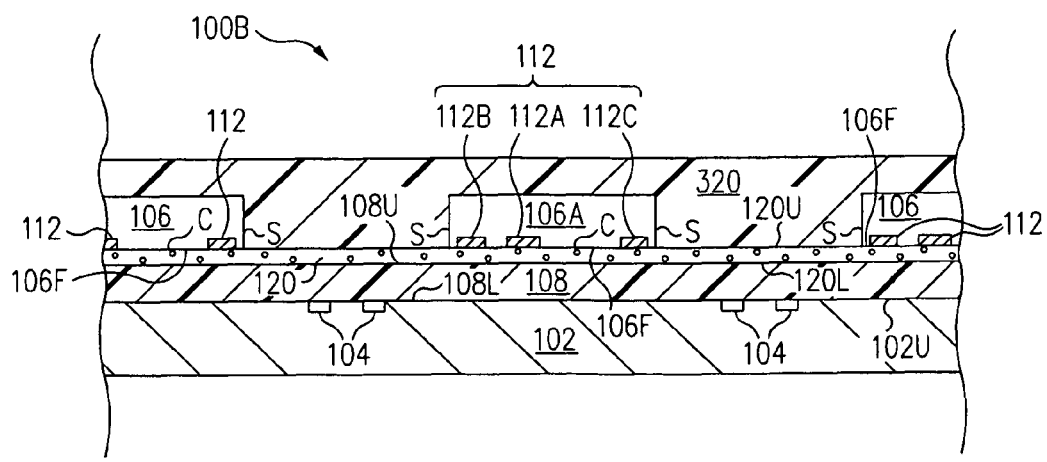

FIG. 3 is a cross-sectional view of assembly 100B of FIG. 1B at a further stage during the fabrication of a plurality of wafer level electronic component packages in accordance with one embodiment of the present invention. Referring now to FIG. 3, electronic components 106 are encapsulated, sometimes called overmolded, in an encapsulant 320. Encapsulant 320 protects electronic components 106 from the ambient environment.

Illustratively, a liquid encapsulant is applied and cured to form encapsulant 320. In another embodiment, a plastic encapsulant is applied, e.g., using a transfer or injection mold process, to form encapsulant 320.

Figure 4:
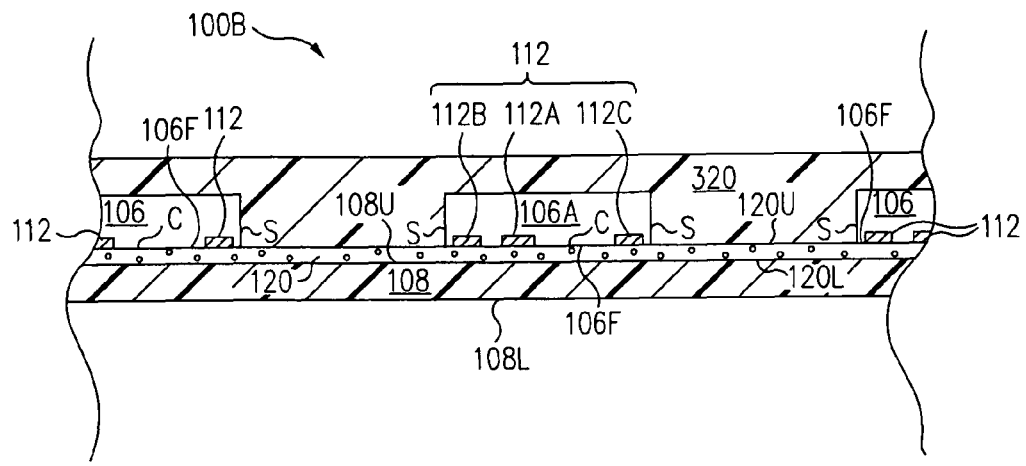

FIG. 4 is a cross-sectional view of assembly 100B of FIG. 3 at a further stage during the fabrication of a plurality of wafer level electronic component packages in accordance with one embodiment of the present invention. Referring now to FIGS. 3 and 4 together, support strip 102 is removed from dielectric strip 108. In one embodiment, upper surface 102U of support strip 102 is pretreated, e.g., a release agent is applied, to facilitate easy removal of support strip 102. In one embodiment, support strip 102 is reusable and thus reused to fabricate another assembly 100B as illustrated in FIG. 1B after removal from dielectric strip 108 thus minimizing the cost of fabricating assembly 100B.

Once support strip 102 is removed, encapsulant 320 provides rigidity and support for assembly 100B. Further, removal of support strip 102 exposes lower surface 108L of dielectric strip 108 for further processing as discussed further below.

FIG. 5 is a cross-sectional view of assembly 100B of FIG. 4 at a further stage during the fabrication of a plurality of wafer level electronic component packages in accordance with one embodiment of the present invention. Referring now to FIG. 5, a plurality of via apertures 522 are formed using a laser, i.e., using laser ablation. Via apertures 522 are sometimes called first via apertures.

Via apertures 522 extend through dielectric strip 108 and through adhesive strip 120 to bond pads 112 of electronic components 106. In one embodiment, via apertures 522 are cylindrical in shape. Bond pads 112 are exposed through via apertures 522.

In one embodiment, the laser intensity is set to be sufficient to remove dielectric strip 108 and adhesive strip 120. However, the laser intensity is set to be insufficient to remove bond pads 112. Accordingly, pulsing of the laser forms a single via aperture 522 extending through dielectric strip 108 and through adhesive strip 120 to a bond pad 112 of electronic components 106. The laser is then stepped to the next location to form the next via aperture 522.

To illustrate, electronic component 106A includes bond pads 112A, 112B, and 112C on front surface 106F of electronic component 106A. Via apertures 522A, 522B, 522C of the plurality of via apertures 522 extend through dielectric strip 108 and through adhesive strip 120 to bond pads 112A, 112B, 112C, respectively.

To further illustrate, initially, the laser is pulsed to form via aperture 522A. The laser is then stepped and pulsed again to form via aperture 522B. The laser is then stepped and pulsed again to form via aperture 522C. The laser is stepped and pulsed repeatedly until all of via apertures 522 are formed. However, in another embodiment, a plurality of lasers are simultaneously pulsed to form some or all of via apertures 522 simultaneously. In yet other embodiments, via apertures 522 are formed using selective etching, mechanical drilling, or other techniques.

FIG. 6 is a cross-sectional view of assembly 100B of FIG. 5 at a further stage during the fabrication of a plurality of wafer level electronic component packages in accordance with one embodiment of the present invention. Referring now to FIGS. 5 and 6 together, via apertures 522 are filled with an electrically conductive material, e.g., a metal or metal containing material, an electrically conductive adhesive such as a silver filled adhesive or polymer, or solder paste, to form electrically conductive vias 624. Vias 624 are sometimes called first vias.

In one embodiment, copper or a copper containing material is plated in via apertures 522 to form vias 624. In another embodiment, via apertures 522 are filled with an electrically conductive adhesive, which is then cured if necessary, to form vias 624. In yet another embodiment, via apertures 522 are filled with a solder paste. Assembly 100B is then heated to reflow the solder paste to form vias 624.

After formation of vias 624, any excess electrically conductive material formed on lower surface 108L of dielectric strip 108 is removed. Illustratively, an etch or physical grinding process is used.

In one embodiment, an over-etch process is used to slightly over-etch vias 624. Thus, vias 624 remain recessed within via apertures 522. This ensures that shorting between vias 624 from excess electrically conductive material is avoided.

Vias 624 are electrically connected to corresponding bond pads 112. To illustrate, vias 624A, 624B, 624C of the plurality of vias 624 are electrically connected to bond pads 112A, 112B, 112C, respectively. Vias 624 extend from bond pads 112, through adhesive strip 120 and through dielectric strip 108 to be adjacent or slightly recessed from (above in the view of FIG. 6) lower surface 108L of dielectric strip 108.

Bond pads 112 are directly connected to corresponding vias 624. Stated another way, bond pads 112 are electrically connected to corresponding vias 624 without the use of a solder, e.g., without the use of flip chip bumps, and without the need to form a solder wetting layer, e.g., a nickel/gold layer, on bond pads 112. This maximizes the reliability of the electrical connection between vias 624 and bond pads 112, while at the same time minimizes impedance.

Further, since dielectric strip 108 is directly attached to electronic components 106 by adhesive strip 120 and bond pads 112 are directly connected to corresponding vias 624, the use of an underfill material is obviated. This simplifies manufacturing, enhances reliability, and thus reduces cost.

After formation of vias 624, assembly 100B is inspected, e.g., optically using an automatic inspection system, to insure that all via apertures 522 are properly filled with electrically conductive material, i.e., to inspect the integrity of vias 624. In one embodiment, any defective or unformed vias 624 detected during the inspection are corrected, e.g., by etch removal of vias 624, reapplication of the electrically conductive material to reform vias 624, e.g., re-plating, and removal of any excess electrically conductive material on lower surface 108L of dielectric strip 108.

In this manner, the wafer level electronic component packages are fabricated with a maximum yield, e.g., essentially a 100 percent yield. This further minimizes the fabrication cost of the wafer level electronic component packages.

Figure 7:
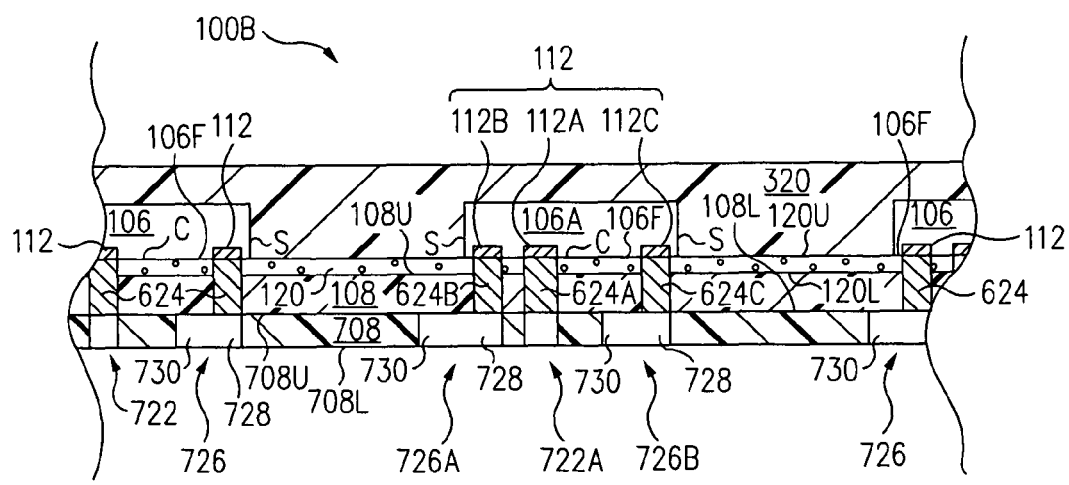

FIG. 7 is a cross-sectional view of assembly 100B of FIG. 6 at a further stage during the fabrication of a plurality of wafer level electronic component packages in accordance with one embodiment of the present invention. Referring now to FIG. 7, a second dielectric strip 708 is mounted to dielectric strip 108. More particularly, an upper, e.g., first, surface 708U of dielectric strip 708 is mounted to lower surface 108L of dielectric strip 108.

For example, dielectric strip 708 is mounted to dielectric strip 108 using a tack cure. More particularly, dielectric strip 708 is pressed on to dielectric strip 108. Assembly 100B is heated to fuse together and bond dielectric strip 708 to dielectric strip 108.

Illustratively, dielectric strip 108 and dielectric strip 708 are polytetrafluoroethylene (PTFE), liquid crystal polymer (LCP) or a non-woven arimid although other low-K dielectric materials are used in other embodiments.

A plurality of via apertures 722 and trace channels 726 are formed using a laser, i.e., using laser ablation. Via apertures 722 and trace channels 726 extend through dielectric strip 708 and to vias 624. Via apertures 722 are sometimes called second via apertures.

In one embodiment, via apertures 722 are cylindrical in shape and extend vertically, i.e., in a first direction perpendicular to front surface 106F of electronic components 106, through dielectric strip 708 to vias 624. Trace channels 726 are trenches extending horizontally, i.e., in a second direction perpendicular to the first direction and parallel to front surface 106F of electronic components 106, from vias 624.

Vias 624 are exposed through via apertures 722 and trace channels 726. To illustrate, a first via aperture 722A of the plurality of via apertures 722 extends through dielectric strip 708 to via 624A.

To further-illustrate, a first trace channel 726A of the plurality of trace channels 726 extends through dielectric strip 708 to via 624B. More particularly, via 624B is exposed at a first end 728 of trace channel 726A. Trace channel 726A extends horizontally outwards from a center C of electronic component 106A and outwards from via 624B to a second end 730 of trace channel 726A in a fan-out configuration.

To further illustrate, a second trace channel 726B of the plurality of trace channels 726 extends through dielectric strip 708 to via 624C. More particularly, via 624C is exposed at a first end 728 of trace channel 726B. Trace channel 726B extends horizontally inwards toward center C from via 624C to a second end 730 of trace channel 726B in a fan-in configuration.

In one embodiment, a laser is stepped and pulsed repeatedly to form via apertures 722 and trace channels 726. However, in another embodiment, a plurality of lasers are simultaneous pulsed to form some or all of via apertures 722 and trace channels 726 simultaneously. During formation of trace channels 726, the laser is moved during pulsing to form the horizontal trenches of trace channels 726.

By controlling the laser intensity and pulse time, via apertures 722 and trace channels 726 are all formed to have the same depth, this depth being equal to the thickness of dielectric strip 708. This simplifies and enhances reliability of filling, e.g., plating, of via apertures 722 and trace channels 726 with an electrically conductive material as discussed below.

Figure 8:
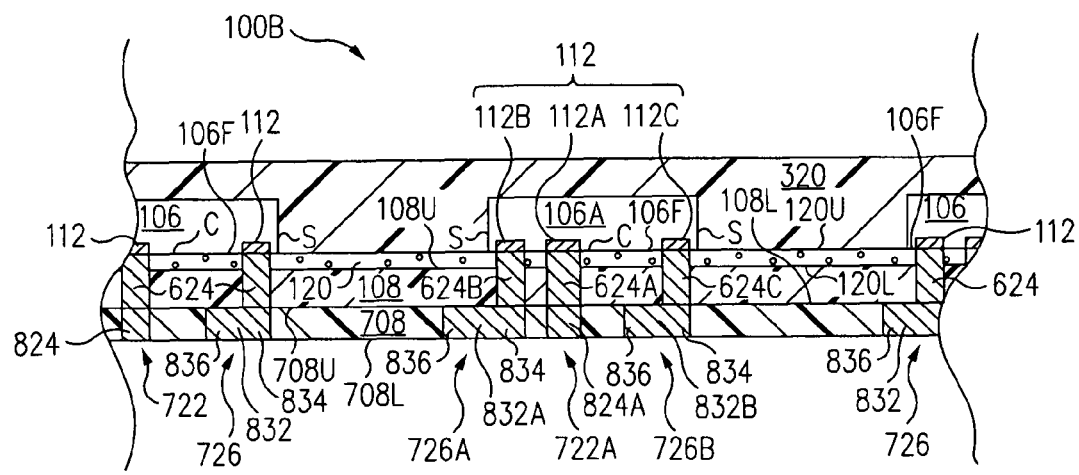

FIG. 8 is a cross-sectional view of assembly 100B of FIG. 7 at a further stage during the fabrication of a plurality of wafer level electronic component packages in accordance with one embodiment of the present invention. Referring now to FIGS. 7 and 8 together, via apertures 722 and trace channels 726 are filled with an electrically conductive material, e.g., a metal or metal containing material, an electrically conductive adhesive, or solder paste, to form electrically conductive vias 824 and electrically conductive traces 832, respectively. Vias 824 are sometimes called second vias.

In one embodiment, copper or a copper containing material is plated in via apertures 722 and trace channels 726 to form vias 824 and traces 832, respectively. In another embodiment, via apertures 722 and trace channels 726 are filled with an electrically conductive adhesive, which is then cured if necessary, to form vias 824 and traces 832, respectively. In yet another embodiment, via apertures 722 and trace channels 726 are filled with a solder paste. Assembly 100B is then heated to reflow the solder paste to form vias 824 and traces 832, respectively.

Vias 824 form vertical electrical connectors, i.e., form electrical connectors extending vertically. Traces 832 form horizontal electrical connectors, i.e., form electrical connectors extending horizontally.

After formation of vias 824 and traces 832, any excess electrically conductive material formed on a lower, e.g., second, surface 708L of dielectric strip 708 is removed. Illustratively, an etch or physical grinding process is used. In one embodiment, an over-etch process is used to slightly over-etch vias 824 and traces 832. This ensures that shorting between vias 824 and/or traces 832 from excess electrically conductive material is avoided.

Vias 824 and traces 832 are electrically connected to corresponding vias 624. To illustrate, a first via 824A of the plurality of vias 824 is electrically connected to via 624A. Vias 824 extend from vias 624, through dielectric strip 708 to be adjacent or recessed from lower surface 708L of dielectric strip 708.

To further illustrate, a first trace 832A of the plurality of traces 832 is electrically connected to via 624B. More particularly, a first end 834 of trace 832A is electrically connected to via 624B. Trace 832A extends horizontally outwards from a center C of electronic component 106A and outwards from via 624B to a second end 836 of trace 832A in a fan-out configuration.

To further illustrate, a second trace 832B of the plurality of traces 832 is electrically connected to via 624C. More particularly, a first end 834 of trace 832B is electrically connected to via 624C. Trace 832B extends horizontally inwards toward center C from via 624C to a second end 836 of trace 832B in a fan-in configuration.

Although a fan-out trace and a fan-in trace, i.e., traces 832A, 832B, respectively, are illustrated and discussed, in other embodiments, only fan-in traces or fan-out traces are formed.

After formation of vias 824 and traces 832, assembly 100B is inspected to insure that all via apertures 722 and trace channels 726 are properly filled with electrically conductive material, i.e., to inspect the integrity of vias 824 and traces 832.

In one embodiment, any defective or unformed vias 824 and traces 832 detected during the inspection are corrected, e.g., by etch removal of vias 824 and traces 832, reapplication of the electrically conductive material to reform vias 824 and traces 832, and removal of any excess electrically conductive material on lower surface 708L of dielectric strip 708. In this manner, the wafer level electronic component packages are fabricated with a maximum yield.

Figure 9:
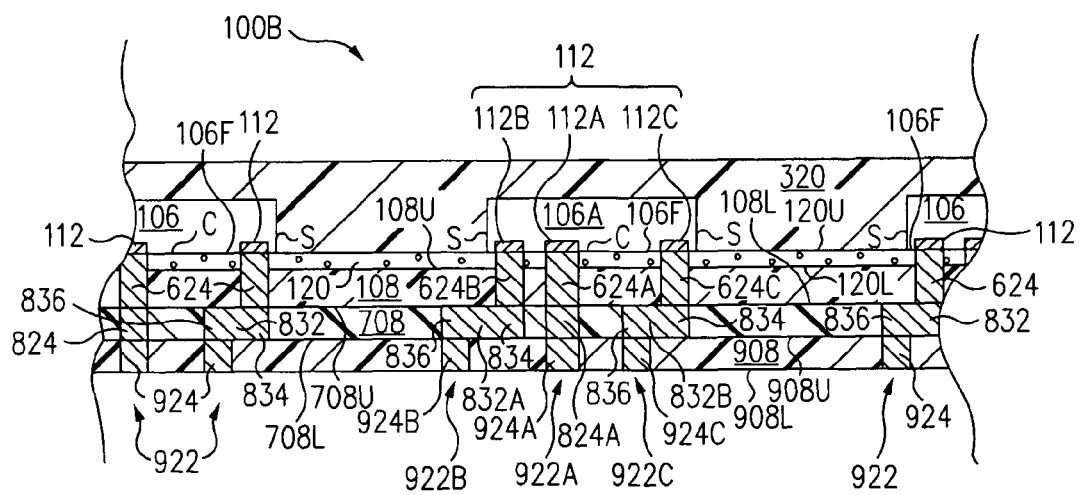

FIG. 9 is a cross-sectional view of assembly 100B of FIG. 8 at a further stage during the fabrication of a plurality of wafer level electronic component packages in accordance with one embodiment of the present invention. Referring now to FIG. 9, a third dielectric strip 908 is mounted to dielectric strip 708. More particularly, an upper, e.g., first, surface 908U of dielectric strip 908 is mounted to lower surface 708L of dielectric strip 708. Dielectric strip 908 is similar to dielectric strip 708 and mounted in a manner similar to that discussed above with regards to mounting of dielectric strip 708 to dielectric strip 108.

A plurality of via apertures 922 are formed using a laser, i.e., using laser ablation. Via apertures 922 extend through dielectric strip 908 to vias 824 and traces 832. In one embodiment, via apertures 922 are cylindrical in shape. Via apertures 922 are sometimes called third via apertures.

Vias 824 and second ends 836 of traces 832 are exposed through via apertures 922. To illustrate, via apertures 922A, 922B, 922C of the plurality of via apertures 922 extend through dielectric strip 908 to via 824A and second ends 836 of traces 832A, 832B, respectively.

Via apertures 922 are formed in a manner similar to via apertures 522 of FIG. 5 so formation of via apertures 922 is not discussed in detail to avoid detracting from the principals of the invention.

Via apertures 922 are filled with an electrically conductive material, e.g., a metal or metal containing material, an electrically conductive adhesive, or solder paste, to form electrically conductive vias 924. Via apertures 922 are filled to form vias 924 in a manner similar to that discussed with regards to vias 624 of FIG. 6 so formation of vias 924 is not discussed in detail to avoid detracting from the principals of the invention. Vias 924 are sometimes called third vias.

After formation of vias 924, any excess electrically conductive material formed on a lower, e.g., second, surface 908U of dielectric strip 908 is removed. Illustratively, an etch or physical grinding process is used. In one embodiment, an over-etch process is used to slightly over-etch vias 924. Thus, vias 924 remain recessed within via apertures 922. This ensures that shorting between vias 924 from excess electrically conductive material is avoided.

Vias 924 are electrically connected to corresponding vias 824 and second ends 836 of traces 832. To illustrate, vias 924A, 924B, 924C of the plurality of vias 924 are electrically connected to via 824A and second ends 836 of traces 832A, 832B, respectively. Vias 924 extend from vias 824 and second ends 836 of traces 832 through dielectric strip 908 to be adjacent or slightly recessed from lower surface 908L of dielectric strip 908.

In one embodiment, vias 924 are formed to have a larger diameter than the width of traces 832 and/or the diameter of vias 824. By forming vias 924 with the appropriate diameter, tolerance in the positioning of vias 924 is accommodated. Stated another way, by forming vias 924 with a sufficiently large diameter, electrical contact between vias 924 and vias 824/traces 832 is assured.

After formation of vias 924, assembly 100B is inspected to insure that all via apertures 922 are properly filled with electrically conductive material, i.e., to inspect the integrity of vias 924.

In one embodiment, any defective or unformed vias 924 detected during the inspection are corrected, e.g., by etch removal of vias 924, reapplication of the electrically conductive material to reform vias 924, and removal of any excess electrically conductive material on lower surface 908L of dielectric strip 908. In this manner, the wafer level electronic component packages are fabricated with a maximum yield.

Figure 10:
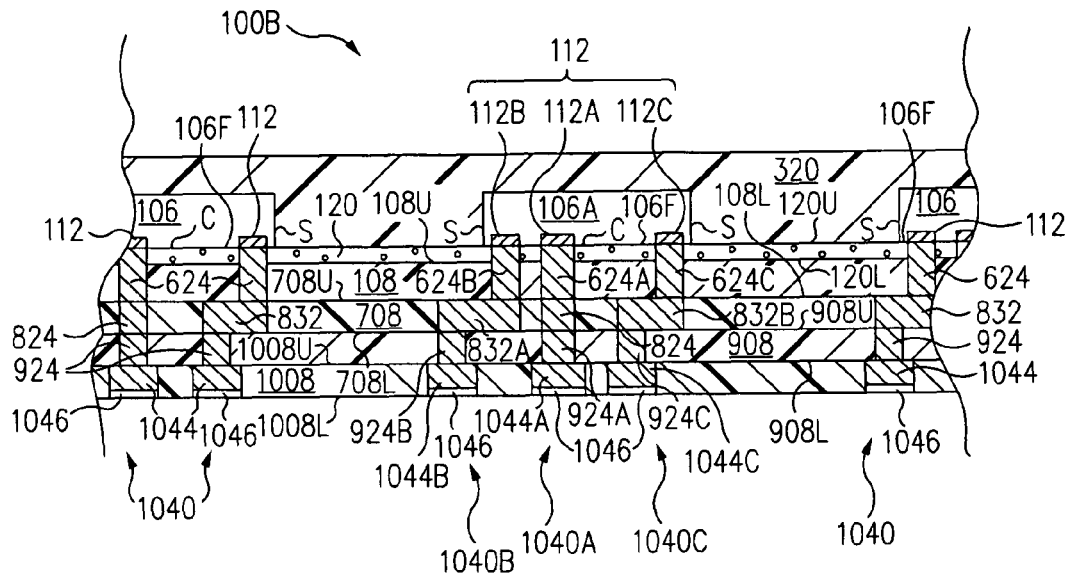

FIG. 10 is a cross-sectional view of assembly 100B of FIG. 9 at a further stage during the fabrication of a plurality of wafer level electronic component packages in accordance with one embodiment of the present invention. Referring now to FIG. 10, a fourth dielectric strip 1008 is mounted to dielectric strip 908. More particularly, an upper, e.g., first, surface 1008U of dielectric strip 1008 is mounted to lower surface 908L of dielectric strip 908. Dielectric strip 1008 is similar to dielectric strip 708 and mounted in a manner similar to that discussed above with regards to mounting of dielectric strip 708 to dielectric strip 108.

A plurality of land apertures 1040 are formed using a laser, i.e., using laser ablation. Land apertures 1040 extend through dielectric strip 1008 to vias 924. In one embodiment, land apertures 1040 are cylindrical in shape but can be patterned in a variety of shapes depending upon the particular interconnection structure used, e.g., interconnection balls or lands.

Vias 924 are exposed through land apertures 1040. To illustrate, land apertures 1040A, 1040B, 1040C of the plurality of land apertures 1040 extend through dielectric strip 1008 to vias 924A, 924B, 924C, respectively.

Land apertures 1040 are formed in a manner similar to via apertures 522 of FIG. 5 so formation of land apertures 1040 is not discussed in detail to avoid detracting from the principals of the invention.

Land apertures 1040 are filled with an electrically conductive material, e.g., a metal or metal containing material, an electrically conductive adhesive, or solder paste, to form electrically conductive lands 1044. Land apertures 1040 are filled to form lands 1044 in a manner similar to that discussed with regards to vias 624 of FIG. 6 so formation of lands 1044 is not discussed in detail to avoid detracting from the principals of the invention. After formation of lands 1044, any excess electrically conductive material formed on a lower, e.g., second, surface 1008L of dielectric strip 1008 is removed. Illustratively, an etch or physical grinding process is used.

In one embodiment, an over-etch process is used to slightly over-etch lands 1044. Thus, lands 1044 remain recessed within land apertures 1040. This ensures that shorting between lands 1044 from excess electrically conductive material is avoided.

Lands 1044 are electrically connected to corresponding vias 924. To illustrate, lands 1044A, 1044B, 1044C of the plurality of lands 1044 are electrically connected to vias 924A, 924B, 924C, respectively. Lands 1044 extend from vias 924 through dielectric strip 1008 to be adjacent or slightly recessed from lower surface 1008L of dielectric strip 1008.

After formation of lands 1044, assembly 100B is inspected to insure that all land apertures 1040 are properly filled with electrically conductive material, i.e., to inspect the integrity of lands 1044. In one embodiment, any defective or unformed lands 1044 detected during the inspection are corrected, e.g., by etch removal of lands 1044, reapplication of the electrically conductive material to reform lands 1044, and removal of any excess electrically conductive material on lower surface 1008L of dielectric strip 1008. In this manner, the wafer level electronic component packages are fabricated with a maximum yield.

After formation of lands 1044, in one embodiment, a solder on paste (SOP) is applied to lands 1044. This solder on paste is reflowed, i.e., heated to a melt and cooled to resolidify, to form solder lands, which are represented as item 1046 in FIG. 10 in accordance with this embodiment.

In accordance with this embodiment, the resulting wafer level electronic component package is a land grid array package. The solder lands are used to electrically connect the wafer level electronic component package to the larger substrate, e.g., a mother or daughter board, for example, using a high lead solder such as a 90/10 lead/tin solder.

In another embodiment, a ball grid array package is formed. More particular, after formation of lands 1044, an organic solderability protectant (OSP), sometimes called an organic solderability preservative, is applied to lands 1044. The organic solderability protectant, which is represented as item 1046 in FIG. 10 in accordance with this embodiment, enhances the solder wet-ability of lands 1044. For simplicity of discussion, the organic solderability protectant is hereinafter referred to as OSP 1046. However, in another embodiment, OSP 1046 is not used.

Figure 11:
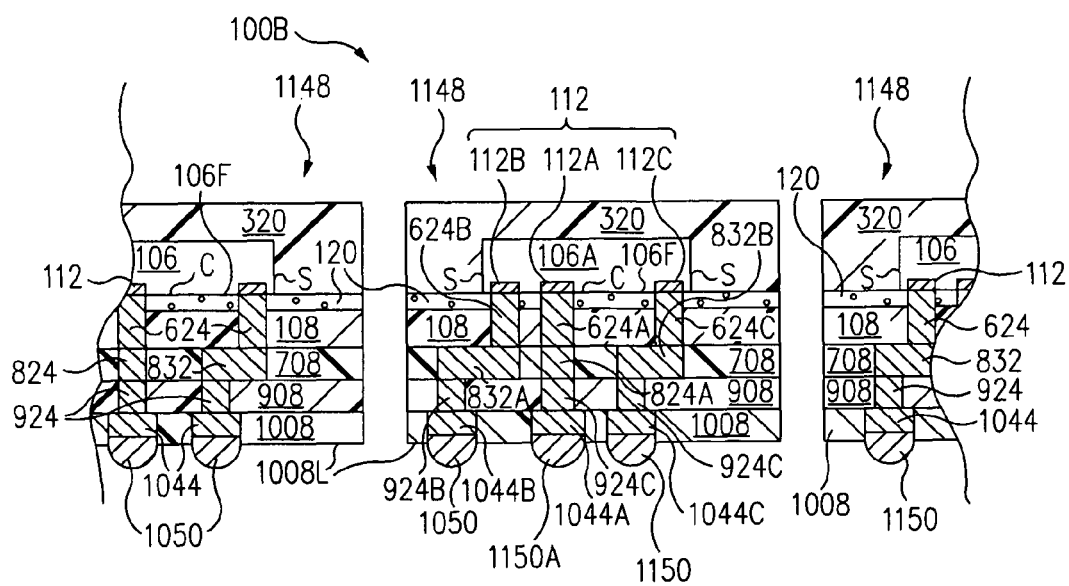

FIG. 11 is a cross-sectional view of assembly 100B of FIG. 10 at a further stage during the fabrication of a plurality of wafer level electronic component packages 1148 in accordance with one embodiment of the present invention. Referring now to FIG. 11, electrically conductive interconnection balls 1150, e.g., eutectic lead/tin solder, are formed on lands 1044. Interconnection balls 1150 are formed in a conventional manner. During formation of interconnection balls 1150, OSP 1046 is consumed.

Interconnection balls 1150 are used to electrically connect wafer level electronic component packages 1148 to the larger substrate, e.g., a mother or daughter board. Assembly 100B is then singulated, e.g., using a mechanical saw or laser, to form the plurality of wafer level electronic component packages 1148.

Each interconnection ball 1150 is electrically connected to a corresponding bond pad 112 as discussed above. In this manner, the pattern of bond pads 112 is redistributed to the pattern of interconnection balls 1150.

For example, bond pads 112 are formed on front surface 106F directly adjacent sides S of electronic components 106 in a typical wirebond configuration pattern. However, interconnection balls 1150 are distributed in an array pattern. Thus, the wirebond configuration pattern of bond pads 112 is redistributed to an array pattern of interconnection balls 1150. Although an array pattern of interconnection balls 1150 is discussed above, interconnection balls 1150 are distributed in any one of a number of desired patterns in other embodiments.

Further, interconnection balls 1150 are connected to bond pads 112 using a minimum path length. To illustrate, bond pad 112A is coupled to a first interconnection ball 1150A of the plurality of interconnection balls 1150 by vias 624A, 824A, 924A, land 1044A, which are directly aligned with one another. By using a minimum path length, heat transfer between bond pads 112 and more generally between electronic components 106 and interconnection balls 1150 is maximized thus improving the thermal performance of wafer level electronic component packages 1148. For similar reasons, impedance between bond pads 112 and interconnection balls 1150 is minimized.

As set forth above, (1) a dielectric strip is applied; (2) the dielectric strip is laser patterned to form via apertures and/or trace channels; (3) the via apertures and/or trace channels are filled with electrically conductive material to form vias and/or traces; (4) excess electrically conductive material is removed from the lower surface of the dielectric strip; and (5) the formed vias and/or traces are inspected and corrected, if necessary. This process is repeated any number of desired times until the desired redistribution is achieved.

Further, since the via apertures 522, 722, 922 and/or trace channels 726 are formed with a laser in one embodiment, any changes in the design layout of the via apertures 522, 722, 922 and/or trace channels 726 are relatively simple to execute. More particularly, these design layout changes are made in the computer software, e.g., the CAD software, which drives the laser. Accordingly, the design layout changes are made with some relatively simple programming and executed immediately.

Referring still to FIG. 11, although four dielectric strips 108, 708, 908, 1008 are illustrated and discussed above, more or less than four dielectric strips are used in other embodiments. Generally, at least one dielectric strip, e.g., dielectric strip 108, is used.

Further, although vias 624, 824, 924, traces 832, and lands 1044 are discussed above as being formed in various dielectric strips 108, 708, 908, and 1008 for purposes of discussion, in light of this disclosure, those of skill in the art will understand that vias, traces, lands and/or combinations thereof can be formed in any single dielectric strip 108, 708, 908, or 1008.

Further, although vias 624, 824, 924, traces 832, and lands 1044 are discussed as distinct types of structures for purposes of discussion, in light of this disclosure, those of skill in the art will understand that vias 624, 824, 924, traces 832, and lands 1044 can be similar in structure. For example, a via or trace can form a land.

Still further, via apertures 522, 722, 922, trace channels 726 and land apertures 1040 are filled immediately after formation, i.e., before application of the next dielectric strip, with an electrically conductive material to form the vias 624, 824, 924, traces 832 and lands 1044, respectively, in the discussion above. However, in an alternative embodiment, via apertures 522, 722, 922, trace channels 726 and land apertures 1040 are formed in some or all of dielectric strips 108, 708, 908, 1008. After formation, via apertures 522, 722, 922, trace channels 726 and land apertures 1040 are filled at the same time, e.g., in a single plating operation, with an electrically conductive material to form vias 624, 824, 924, traces 832 and lands 1044, respectively.

Figure 12:
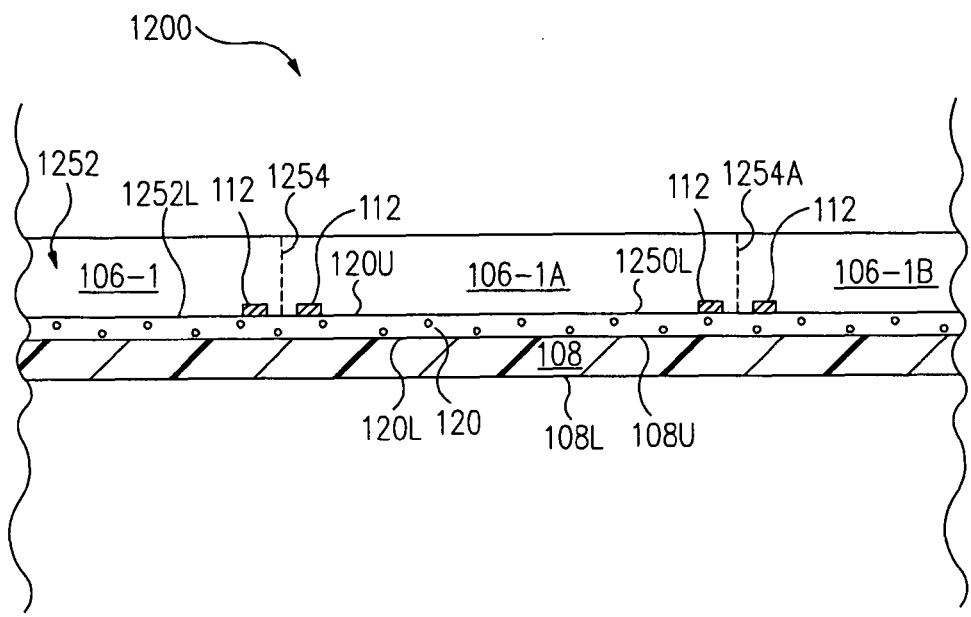
FIG. 12 is a cross-sectional view of an assembly during the fabrication of a plurality of wafer level electronic component packages in accordance with another embodiment of the present invention.

FIG. 12 is a cross-sectional view of an assembly 1200 during the fabrication of a plurality of wafer level electronic component packages in accordance with one embodiment of the present invention. Referring now to FIG. 12, assembly 1200 includes an electronic component substrate 1252 such as a silicon wafer. Electronic component substrate 1252 includes a plurality of electronic components 106-1 integrally connected together. Electronic components 106-1 include bond pads 112 on front surfaces 106F of electronic components 106-1, and more generally on a lower, e.g., first, surface 1252L of electronic component substrate 1252.

Electronic components 106-1 are integrally connected together in an array, e.g., a 2×2, 3×3 . . . or n×m array. Each of electronic components 106-1 is delineated by a singulation street 1254, which is located between adjacent electronic components 106-1. For example, a first singulation street 1254A of the plurality of singulation streets 1254 delineates a first electronic component 106-1A from a second electronic component 106-1B of the plurality of electronic components 106-1. The other electronic components 106-1 are similarly delineated from adjacent electronic components 106-1 by corresponding singulation streets 1254.

Upper surface 108U of dielectric strip 108 is mounted to front surfaces 106F of electronic components 106-1, and more generally to lower surface 1252L of electronic component substrate 1252 with adhesive strip 120. Electronic component substrate 1252 provides rigidity and support for assembly 1200.

Figure 13:
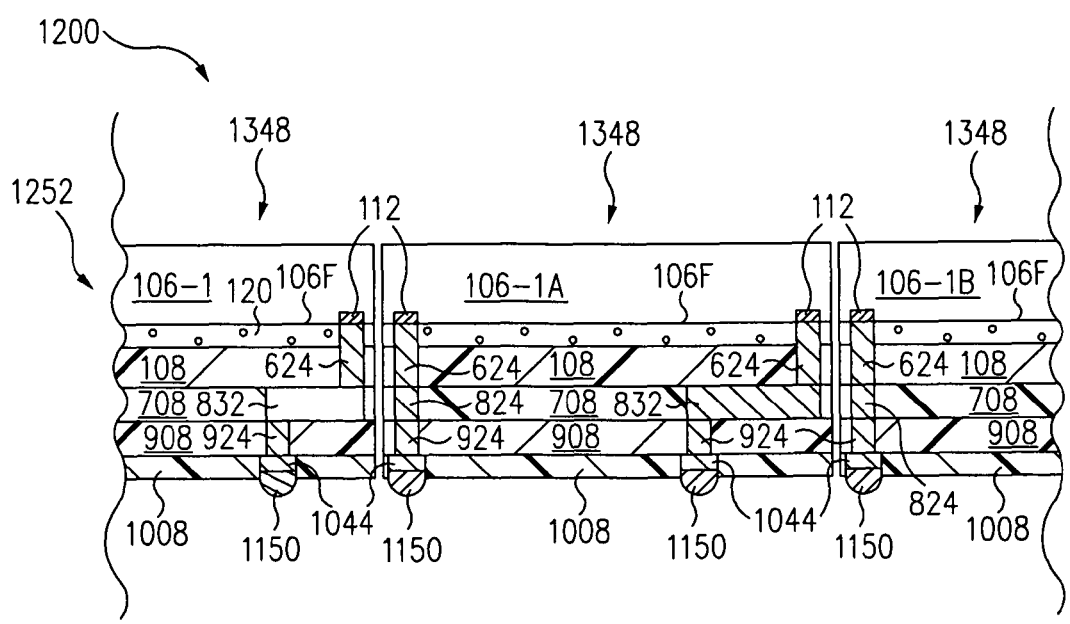
FIG. 13 is a cross-sectional view of the assembly of FIG. 12 at a further stage during the fabrication of a plurality of wafer level electronic component packages in accordance with one embodiment of the present invention.

FIG. 13 is a cross-sectional view of assembly 1200 of FIG. 12 at a further stage during the fabrication of a plurality of wafer level electronic component packages in accordance with one embodiment of the present invention. Referring now to FIG. 13, vias 624, 824, 924, traces 832, and lands 1044 are formed in dielectric strips 108, 708, 908, and 1008 as discussed above in reference to FIGS. 5-11, the discussion of which is incorporated herein by reference in its entirety.

In the embodiment illustrated in FIG. 13, interconnection balls 1150 are formed on lands 1044 to form a ball grid array (BGA) package. Each interconnection ball 1150 is coupled to a corresponding bond pad 112. However, it is to be understood that a land grid array (LGA) package can also be fabricated.

Processing of assembly 1200 is a true wafer scale process. After formation of vias 624, 824, 924, traces 832, lands 1044 in dielectric strips 108, 708, 908, 1008, assembly 1200 is singulated along singulation streets 1254 (FIG. 12) resulting in the fabrication of wafer level electronic component packages 1348. Singulation is performed before or after fabrication of interconnection balls 1150.

In one embodiment of the invention, trace channels 726 (FIGS. 7 and 8) are optimally formed in a shape suited to holding a metal layer, such as a copper metal layer, in place. In one embodiment of the invention, trace channels 726 are formed to be Gaussian in shape. In one embodiment of the invention, trace channels 726 are formed to be v-shaped. In one embodiment of the invention trace channels 726 are formed to be a generally trapezoidal shape.

In one embodiment of the invention, trace channels 726 are also formed such that the inner surface of the trace channel is textured or rough. This provides even better bonding between the metal layer and the surface of the trace channel 726. In one embodiment of the invention, the surface of the metal layer to be applied is also textured, or matted to provide even better bonding between the metal layer and the surface of the trace 726.

One embodiment of the invention is an embedded electronic component package. The method for creating the embedded electronic component package of this embodiment includes coupling a substrate to a first dielectric layer, strip, or panel, and forming first electrically conductive vias and traces in the first dielectric layer. A cavity is then formed in the first dielectric layer and an electronic component is attached in the cavity, with a first surface of the electronic component, including the bond pads, being either level with, partially below, or partially above the first surface of the first dielectric layer. A second dielectric layer, strip, or panel, is then applied to the first dielectric layer, thereby encasing the electronic component in dielectric. Second via apertures are then formed through the second dielectric layer to expose selected bond pads and/or selected first electrically conductive vias and traces. The second via apertures are then filled with an electrically conductive material to form second electrically conductive vias electrically coupled to selected bond pads and selected first electrically conductive vias and traces.

In particular, FIG. 14A is a cross-sectional side view of a substrate 1402, such as a motherboard. In one embodiment of the invention, a conductive layer 1404 of copper traces and pads, or other conductive material, is formed on substrate 1402 and includes various electrical contacts and traces (not shown).

FIG. 14B is a cross-sectional side view of an assembly 1400B including substrate 1402 with a first dielectric layer, strip, or panel, 1408, collectively referred to herein as first dielectric layer 1408. As shown in FIG. 14B, a first dielectric layer second surface 1405 is applied to substrate first surface 1406. In one embodiment of the invention, first dielectric layer 1408 is applied directly to substrate first surface 1406. In other embodiments of the invention, first dielectric layer 1408 is applied to substrate first surface 1406 with adhesives (not shown) such as liquid adhesives or double-sided sticky tapes, although other adhesives are used in other embodiments. In one embodiment of the invention, first dielectric layer 1408 is polytetrafluoroethylene (PTFE), liquid crystal polymer (LCP) or a non-woven arimid although other low-K dielectric materials are used in other embodiments. In other embodiments of the invention dielectric layer 1408 is applied by pressing, screen coating or curtain coating.

Figure 14C:
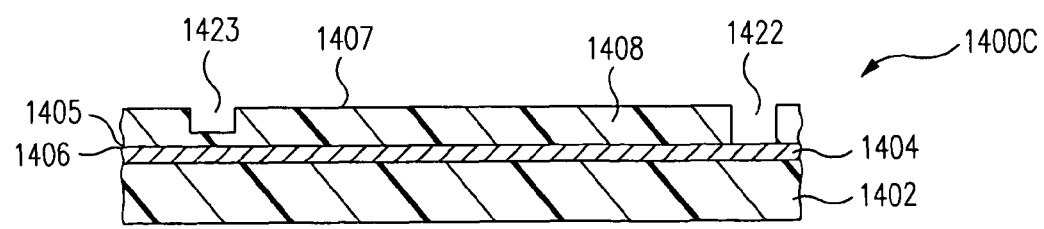
FIG. 14C shows one embodiment of a cross section of the embedded electronic component package sub-assembly of FIG. 14B further in the processing cycle in accordance with the principles of the present invention.

FIG. 14C is a cross-sectional view of an assembly 1400C in accordance with another embodiment of the present invention. Assembly 1400C of FIG. 14C is similar to assembly 1400B of FIG. 14B and only the significant differences are discussed below. Referring now to FIG. 14C, a plurality of first via apertures 1422 and first trace trenches 1423 are formed in a first dielectric layer first surface 1407 of first dielectric layer 1408 by methods similar to those discussed above. In one embodiment of the invention, first via apertures 1422 and first trace trenches 1423 are formed using a laser, i.e., using laser ablation.

Figure 14D:
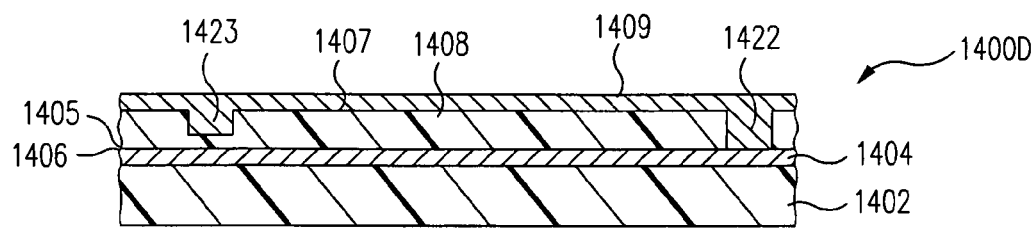
FIG. 14D shows one embodiment of a cross section of the embedded electronic component package sub-assembly of FIG. 14C further in the processing cycle in accordance with the principles of the present invention.

FIG. 14D is a cross-sectional view of assembly 1400D in accordance with one embodiment of the present invention. Assembly 1400D of FIG. 14D is similar to assembly 1400C of FIG. 14C and only the significant differences are discussed below. Referring now to FIG. 14D first dielectric layer first surface 1407 is covered with a first conductive layer 1409. In one embodiment of the invention, first conductive layer 1409 is metal or metal containing material, an electrically conductive adhesive such as a silver filled adhesive or polymer, or solder paste. First conductive layer 1409 is applied in order to fill first via apertures 1422 and first trace trenches 1423 with the electrically conductive material. In one embodiment, copper or a copper containing material is plated in first via apertures 1422 and first trace trenches 1423. In another embodiment, first via apertures 1422 and first trace trenches 1423 are filled with an electrically conductive adhesive, which is then cured if necessary. In yet another embodiment, first via apertures 1422 and first trace trenches 1423 are filled with a solder paste and assembly 1400D is then heated to reflow the solder paste.

Figure 14E:
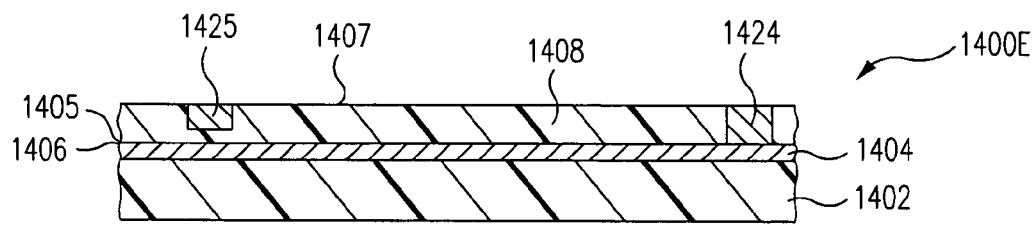
FIG. 14E shows one embodiment of a cross section of the embedded electronic component package sub-assembly of FIG. 14D further in the processing cycle in accordance with the principles of the present invention.

FIG. 14E is a cross-sectional view of assembly 1400E in accordance with one embodiment of the present invention. Assembly 1400E of FIG. 14E is similar to assembly 1400D of FIG. 14D and only the significant differences are discussed below. Referring now to FIG. 14E, any excess material of first conductive layer 1409 is removed and made at least level/planar with first dielectric layer first surface 1407 to thereby form first electrically conductive vias 1424 and first traces 1425 from first via apertures 1422 and first trace trenches 1423. In one embodiment, an over-etch process is used to slightly over-etch first electrically conductive vias 1424 and first traces 1425. This ensures that shorting between vias from excess electrically conductive material is avoided.

Figure 14F:
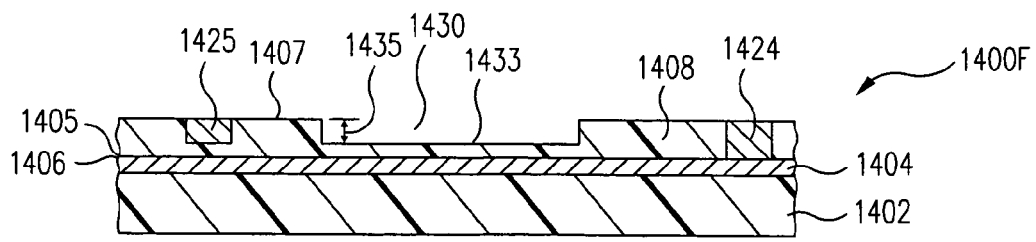
FIG. 14F shows one embodiment of a cross section of the embedded electronic component package sub-assembly of FIG. 14E further in the processing cycle in accordance with the principles of the present invention.

FIG. 14F is a cross-sectional view of assembly 1400F in accordance with one embodiment of the present invention. Assembly 1400F of FIG. 14F is similar to assembly 1400E of FIG. 14E and only the significant differences are discussed below. Referring now to FIG. 14F, a cavity 1430 is formed in first dielectric layer first surface 1407. In one embodiment of the invention, cavity 1430 is formed using a laser, i.e., using laser ablation. As seen in FIG. 14F, cavity 1430 includes a cavity bottom surface 1433. In one embodiment of the invention, cavity bottom surface 1433 is a portion of first dielectric layer 1408. In another embodiment of the invention, cavity bottom surface 1433 is simply first surface 1406 of substrate 1402. In one embodiment of the invention, cavity bottom surface 1433 lies at a depth 1435 of 3 mils (75 microns) below first dielectric layer first surface 1407. In other embodiments, bottom surface 1433 lies at a depth 1435 or greater or less than 3 mils (75 microns) depending on the wafer thickness.

Figure 14G:
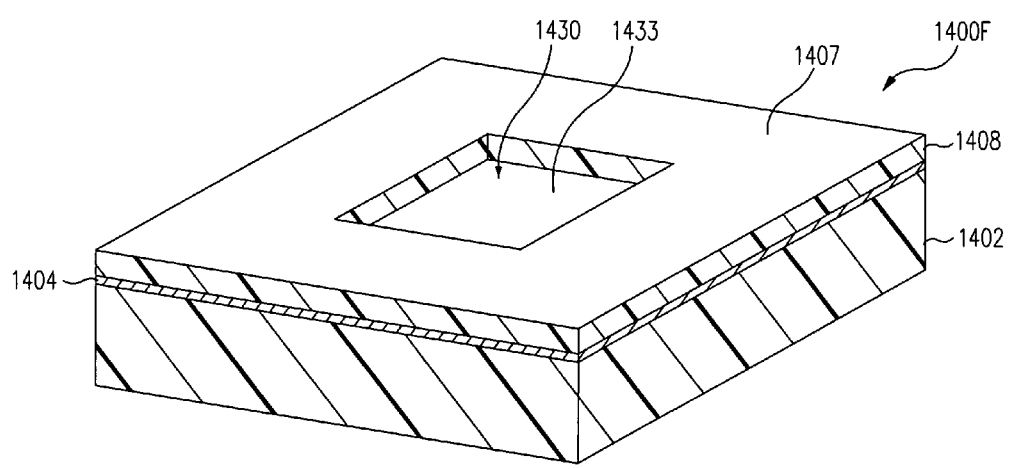
FIG. 14G shows an angled perspective view of the structure of FIG. 14F in accordance with the principles of the present invention.

FIG. 14G shows a angled perspective view of structure 1400F of FIG. 14F including: substrate 1402; substrate conductive layer 1404; first dielectric layer 1408; and cavity 1430 formed in first dielectric layer first surface 1407 and having cavity bottom surface 1433.

Figure 14H:
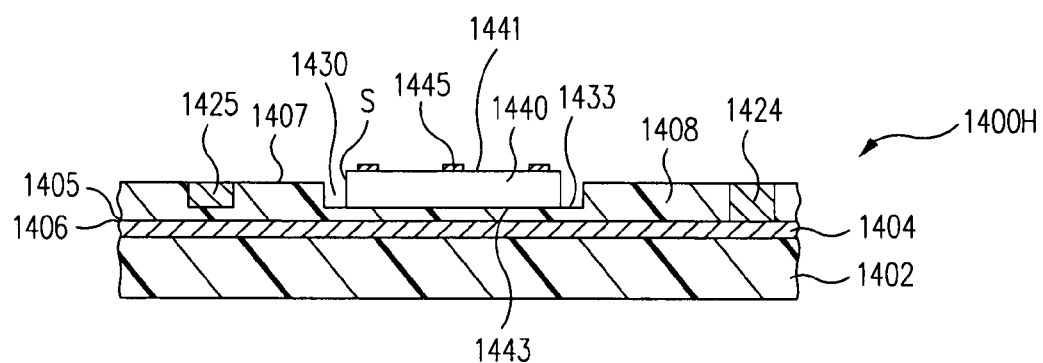
FIG. 14H shows one embodiment of a cross section of the embedded electronic component package sub-assembly of FIG. 14F further in the processing cycle in accordance with the principles of the present invention.

FIG. 14H is a cross-sectional view of assembly 1400H in accordance with one embodiment of the present invention. Assembly 1400H of FIG. 14H is similar to assembly 1400F of FIG. 14F and only the significant differences are discussed below. Referring now to FIG. 14H, an electronic component 1440 is positioned in cavity 1430 with an electronic component second surface 1443 mounted/attached to cavity bottom surface 1433. In one embodiment of the invention, electronic component second surface 1443 of electronic component 1440 is mounted to cavity bottom surface 1433 with adhesives (not shown), e.g., liquid adhesives or double-sided sticky tapes, although other adhesives are used in other embodiments. As discussed above, formed on first surface 1441 of electronic component 1440 are bond pads 1445, e.g., formed of aluminum. Bond pads 1445 are connected to the internal circuitry of electronic component 1440. In one embodiment, bond pads 1445 are distributed in an array on electronic component first surface 1441. In another embodiment, bond pads 1445 are formed on electronic component first surface 1441 directly adjacent side S of electronic component 1440 in a typical wirebond configuration pattern. In one embodiment of the invention, cavity 1430 is formed such that electronic component first surface 1441 is level/planar with first dielectric layer first surface 1407. In one embodiment of the invention, cavity 1430 is formed such that electronic component first surface is slightly above first dielectric layer first surface 1407. In one embodiment of the invention, cavity 1430 is formed such that electronic component first surface 1441 is slightly below first dielectric layer first surface 1407. According to the invention, electronic component 1440 can be an integrated circuit, a passive component, an active component, or any combination thereof.

Figure 14J:
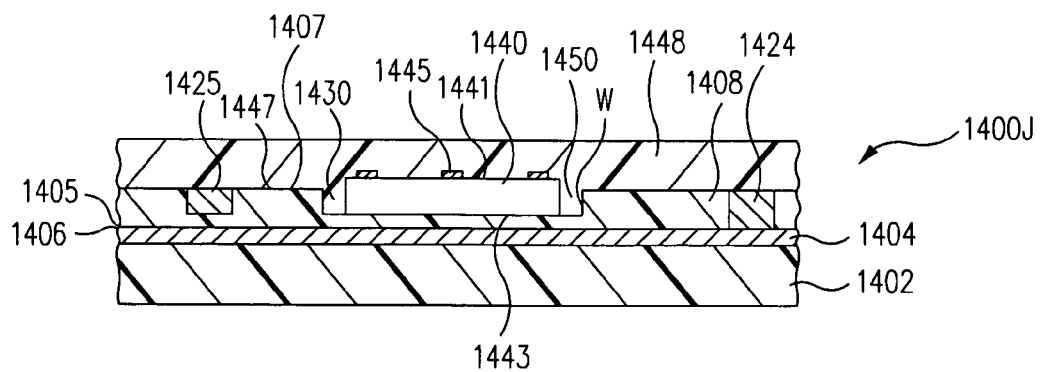
FIG. 14J shows one embodiment of a cross section of the embedded electronic component package sub-assembly of FIG. 14H further in the processing cycle in accordance with the principles of the present invention.
Figure 14I:
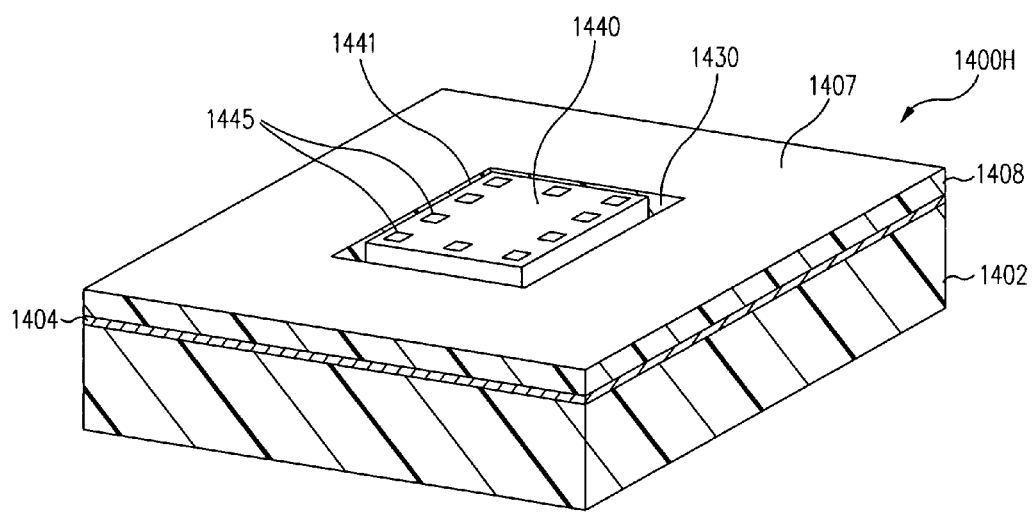
FIG. 14I shows a angled perspective view of structure of FIG. 14H in accordance with the principles of the present invention.

FIG. 14I shows an angled perspective view of structure 1400H of FIG. 14H including: substrate 1402; substrate conductive layer 1404; first dielectric layer 1408; cavity 1430 formed in first dielectric layer first surface 1407; and electronic component 1440 positioned on cavity bottom surface 1433 (not shown) of cavity 1430 with electronic component first surface and bond pads 1445 uncovered.

FIG. 14J is a cross-sectional view of assembly 1400J in accordance with one embodiment of the present invention. Assembly 1400J of FIG. 14J is similar to assembly 1400H of FIG. 14H and only the significant differences are discussed below. Referring now to FIG. 14J, a second dielectric layer, strip, or panel, 1448, herein referred to collectively as second dielectric layer 1448, is applied to first dielectric layer 1408. More particularly, a second dielectric layer second surface 1447 is mounted to first dielectric layer first surface 1407. In one embodiment, second dielectric layer second surface 1447 is applied to first dielectric layer first surface 1407 using a tack cure. More particularly, second dielectric layer second surface 1447 is pressed on to first dielectric layer first surface 1407. In one embodiment, second dielectric layer second surface 1447 is applied to first dielectric layer first surface 1407 by screen coating. In one embodiment, second dielectric layer second surface 1447 is applied to first dielectric layer first surface 1407 by curtain coating. In other embodiments of the invention, any other method of dielectric application is used to apply second dielectric layer 1448.

In one embodiment of the invention, gap portions 1450 between electronic component 1440 sides S and cavity 1430 walls W are filled in by simply pressing second dielectric layer 1448 into first dielectric layer 1408 to form fill gap portions 1450. In another embodiment of the invention, gap portions 1450 are filled by a separate dielectric layer(s) (not shown) applied in a laminate fashion. In yet another embodiment of the invention, second dielectric layer 1448 is custom made to include thicker portions designed to fill gap portions 1450. In yet another embodiment of the invention, second dielectric layer 1448 is applied as a liquid and gap portions 1450 are filled with second dielectric layer 1448 while it is in a liquid state. In this embodiment, second dielectric layer 1448 is then cured. In one embodiment, assembly 1400J is heated to fuse together and bond first dielectric layer 1408 with second dielectric layer 1448. In one embodiment of the invention, first dielectric layer 1408 and second dielectric layer 1448 are polytetrafluoroethylene (PTFE), liquid crystal polymer (LCP) or a non-woven arimid although other low-K dielectric materials are used in other embodiments.

Figure 14K:
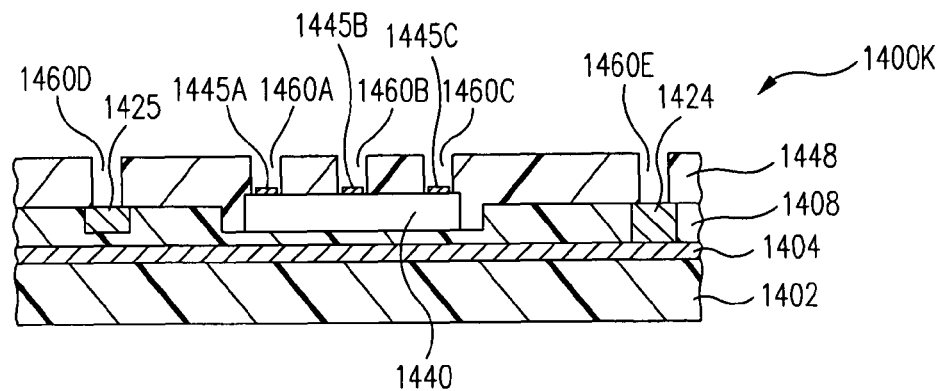
FIG. 14K shows one embodiment of a cross section of the embedded electronic component package sub-assembly of FIG. 14J further in the processing cycle in accordance with the principles of the present invention.

FIG. 14K is a cross-sectional view of an assembly 1400K in accordance with one embodiment of the present invention. Assembly 1400K of FIG. 14K is similar to assembly 1400J of FIG. 14J and only the significant differences are discussed below. Referring now to FIG. 14K, a plurality of second via apertures 1460A, 1460B, 1460C, 1460D and 1460E are formed using a laser, i.e., using laser ablation. Second via apertures 1460A, 1460B, 1460C, 1460D and 1460E extend through second dielectric layer 1448 to selected ones of bond pads 1445A, 1445B, 1445C of electronic component 1440 and selected ones of first electrically conductive vias 1424 and first electrically conductive traces 1425. In one embodiment, second via apertures 1460A, 1460B, 1460C, 1460D and 1460E are cylindrical in shape, however, other shapes are used in other embodiments. Bond pads 1445A, 1445B, 1445C of electronic component 1440 and first electrically conductive vias 1424 and first electrically conductive traces 1425 are exposed through second via apertures 1460A, 1460B, 1460C, 1460D and 1460E. In one embodiment, the laser intensity is set to be sufficient to remove second dielectric layer 1448. However, the laser intensity is set to be insufficient to remove bond pads 1445A, 1445B, 1445C. Accordingly, pulsing of the laser forms a single second via aperture 1460A, 1460B, 1460C, 1460D or 1460E extending through second dielectric layer 1448 to one of bond pads 1445A, 1445B, or 1445C of electronic component 1440. The laser is then stepped to the next location to form the next second via aperture 1460A, 1460B, 1460C, 1460D or 1460E. To illustrate, electronic component 1440 includes bond pads 1445A, 1445B, 1445C on first surface of electronic component 1440. Second via aperture 1460A, 1460B, 1460C of the plurality of second via aperture 1460A, 1460B, 1460C, 1460D and 1460E extend through second dielectric layer 1448 to bond pads 1445A, 1445B, 1445C, respectively. In addition, second via aperture 1460E and 1460D of the plurality of second via aperture 1460A, 1460B, 1460C, 1460D and 1460E extend through second dielectric layer 1448 to first electrically conductive vias 1424 and first electrically conductive traces 1425, respectively. To further illustrate, initially, the laser is pulsed to form second via aperture 1460A. The laser is then stepped and pulsed again to form second via aperture 1460B. The laser is then stepped and pulsed again to form second via aperture 1460C. The laser is stepped and pulsed repeatedly until all of second via aperture 1460A, 1460B, 1460C, 1460D and 1460E are formed. However, in another embodiment, a plurality of lasers are simultaneous pulsed to form some or all of second via aperture 1460A, 1460B, 1460C, 1460D and 1460E simultaneously. In yet other embodiments, second via aperture 1460A, 1460B, 1460C, 1460D and 1460E are formed using selective etching, mechanical drilling, or other techniques.

Figure 14L:
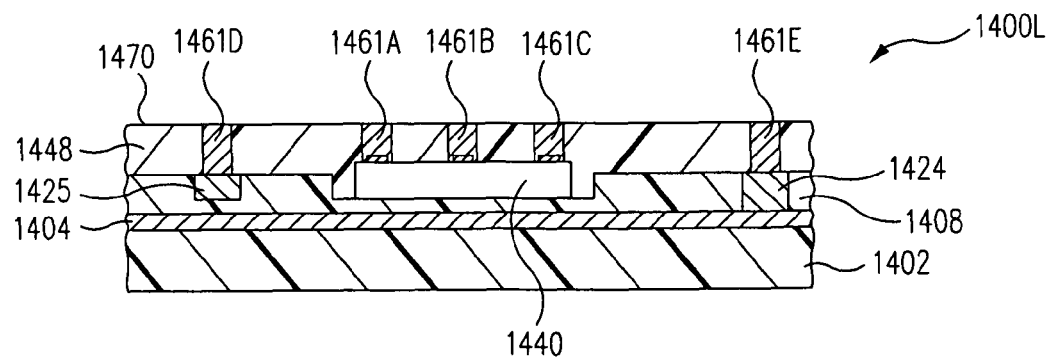
FIG. 14L shows one embodiment of a cross section of an embedded electronic component package sub-assembly in accordance with the principles of the present invention.

FIG. 14L is a cross-sectional view of an assembly 1400L in accordance with one embodiment of the present invention. Assembly 1400L of FIG. 14L is similar to assembly 1400K of FIG. 14K and only the significant differences are discussed below. Referring now to FIGS. 14K and 14L together, second via apertures 1460A, 1460B, 1460C, 1460D and 1460E are filled with an electrically conductive material, e.g., a metal or metal containing material, an electrically conductive adhesive such as a silver filled adhesive or polymer, or solder paste, to form second electrically conductive vias 1461A, 1461B, 1461C, 1461D, and 1461E.

In one embodiment, copper or a copper containing material is plated in second via apertures 1460A, 1460B, 1460C, 1460D and 1460E to form second electrically conductive vias 1461A, 1461B, 1461C, 1461D, and 1461E. In another embodiment, second via apertures 1460A, 1460B, 1460C, 1460D and 1460E are filled with an electrically conductive adhesive, which is then cured, if necessary, to form second electrically conductive vias 1461A, 1461B, 1461C, 1461D, and 1461E. In yet another embodiment, second via apertures 1460A, 1460B, 1460C, 1460D and 1460E are filled with a solder paste. Assembly 1400L is then heated to reflow the solder paste to form second electrically conductive vias 1461A, 1461B, 1461C, 1461D, and 1461E. After formation of second electrically conductive vias 1461A, 1461B, 1461C, 1461D, and 1461E, any excess electrically conductive material formed on second dielectric layer first surface 1470 is removed. Illustratively, an etch or physical grinding process is used. In one embodiment, an over-etch process is used to slightly over-etch second electrically conductive vias 1461A, 1461B, 1461C, 1461D, and 1461E. Thus, second electrically conductive vias 1461A, 1461B, 1461C, 1461D, and 1461E remain recessed within second via apertures 1460A, 1460B, 1460C, 1460D and 1460E. This ensures that shorting between second electrically conductive vias 1461A, 1461B, 1461C, 1461D, and 1461E from excess electrically conductive material is avoided.

Second electrically conductive vias 1461A, 1461B, 1461C, 1461D, and 1461E are electrically connected to corresponding bond pads 1445A, 1445B, 1445C of electronic component 1440 and first electrically conductive vias 1424 and first electrically conductive traces 1425. To illustrate, second electrically conductive vias 1461A, 1461B, 1461C of the plurality of second electrically conductive vias 1461A, 1461B, 1461C are electrically connected to bond pads 1445A, 1445B, 1445C of electronic component 1440, respectively. Consequently, second electrically conductive vias 1461A, 1461B, 1461C extend from bond pads 1445A, 1445B, 1445C, through second dielectric layer 1448, to be adjacent or slightly recessed from second dielectric layer first surface 1470. Likewise, second electrically conductive vias 1461D, 1461E are electrically connected to first electrically conductive vias 1424 and first electrically conductive traces 1425. Consequently, second electrically conductive vias 1461D, 1461E extend from first electrically conductive vias 1424 and first electrically conductive traces 1425, through second dielectric layer 1448, to be adjacent or slightly recessed from second dielectric layer first surface 1470. Stated another way, bond pads 1445A, 1445B, 1445C of electronic component 1440 and first electrically conductive vias 1424 and first electrically conductive traces 1425 are electrically connected to corresponding second electrically conductive vias 1461A, 1461B, 1461C, 1461D, and 1461E, and second dielectric first surface 1447, without the use of a solder, e.g., without the use of flip chip bumps, and without the need to form a solder wetting layer, e.g., a nickel/gold layer, on bond pads 1445A, 1445B, 1445C. This maximizes the reliability of the electrical connection between second electrically conductive vias 1461A, 1461B, 1461C, 1461D, and 1461E and bond pads 1445A, 1445B, 1445C of electronic component 1440 and first electrically conductive vias 1424 and first electrically conductive traces 1425, while at the same time minimizing impedance.

After formation of second electrically conductive vias 1461A, 1461B, 1461C, 1461D, and 1461E, assembly 1400L is inspected, e.g., optically using an automatic inspection system, to insure that all second via apertures 1460A, 1460B, 1460C, 1460D and 1460E are properly filled with electrically conductive material, i.e., to inspect the integrity of second electrically conductive vias 1461A, 1461B, 1461C, 1461D, and 1461E. In one embodiment, any defective or unformed second electrically conductive vias 1461A, 1461B, 1461C, 1461D, and 1461E detected during the inspection are corrected, e.g., by etch removal of second electrically conductive vias 1461A, 1461B, 1461C, 1461D, and 1461E, reapplication of the electrically conductive material to reform second electrically conductive vias 1461A, 1461B, 1461C, 1461D, and 1461E, e.g., re-plating, and removal of any excess electrically conductive material.

In this manner, the embedded electronic component packages are fabricated with a maximum yield, e.g., essentially a 100 percent yield. This further minimizes the fabrication cost of the wafer level electronic component packages.

One embodiment of the invention is an encased electronic component package. The method for creating the encased electronic component package of this embodiment includes coupling a substrate to a first dielectric layer, strip, or panel, and forming first electrically conductive vias and traces in the first dielectric layer. A first surface of an electronic component, is then attached to a first surface of the dielectric layer, strip, or panel in an attachment region. One or more further dielectric layers, strips, or panels, including die cutouts, are then applied to the first dielectric layer, thereby surrounding the electronic component in dielectric. A top dielectric layer is then applied to the structure to cover, and thereby encase, the electronic component. In one embodiment of the invention, the subsequent dielectric layers encapsulating the electronic component are made of prepreg or a similar material, which can be partially re-flowed and then cured to encase the electronic component in a custom fitting operation. Second via apertures are then formed through encasement to expose selected bond pads and/or selected first electrically conductive vias and traces. The second via apertures are then filled with an electrically conductive material to form second electrically conductive vias electrically coupled to selected bond pads and selected first electrically conductive vias and traces.

Figure 15A:
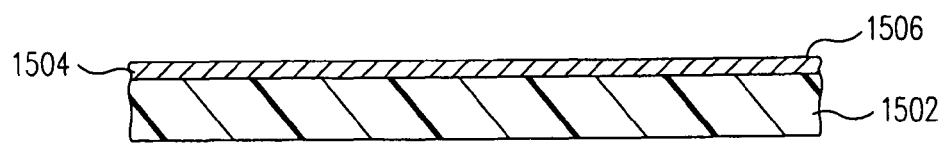
FIG. 15A shows one embodiment of a cross section of an encased electronic component package sub-assembly in accordance with the principles of the present invention.

In particular, FIG. 15A is a cross-sectional side view of a substrate 1502, such as a motherboard. In one embodiment of the invention, a conductive layer 1504 of copper traces and pads, or other conductive material, is formed on substrate first surface 1506 and includes various electrical contacts and traces (not shown).

Figure 15B:
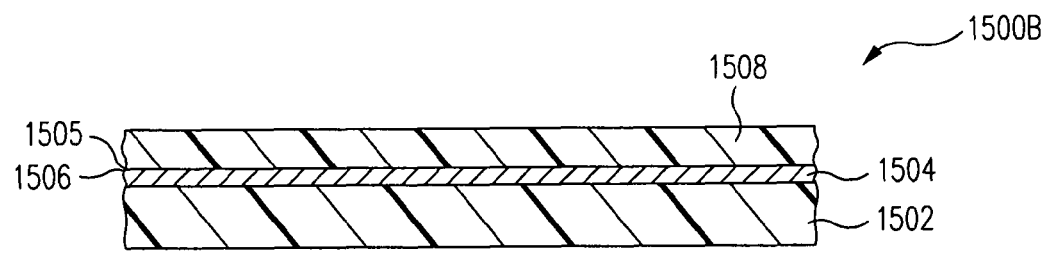
FIG. 15B shows one embodiment of a cross section of the encased electronic component package sub-assembly of FIG. 15A further in the processing cycle in accordance with the principles of the present invention.

FIG. 15B is a cross-sectional side view of an assembly 1500B including substrate 1502 with a first dielectric layer, strip, or panel, 1508, collectively referred to herein as first dielectric layer 1508. As shown in FIG. 15B, a first dielectric layer second surface 1505 is applied to substrate first surface 1506. In one embodiment of the invention, first dielectric layer 1508 is applied directly to substrate first surface 1506. In other embodiments of the invention, first dielectric layer 1508 is applied to substrate first surface 1506 with adhesives (not shown) such as liquid adhesives or double-sided sticky tapes, although other adhesives are used in other embodiments. In one embodiment of the invention, first dielectric layer 1508 is polytetrafluoroethylene (PTFE), liquid crystal polymer (LCP) or a non-woven arimid although other low-K dielectric materials are used in other embodiments. In other embodiments of the invention dielectric layer 1508 is applied by pressing, screen coating or curtain coating.

Figure 15C:
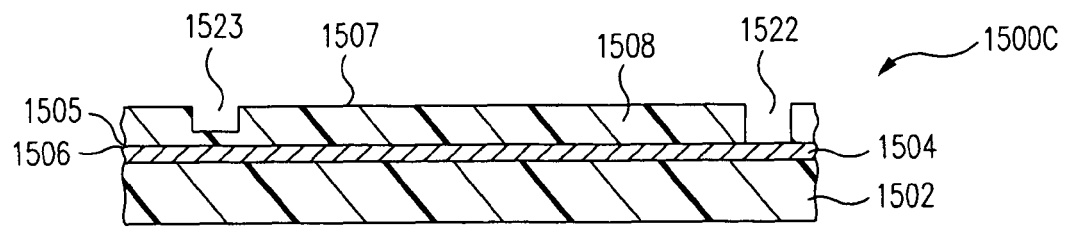
FIG. 15C shows one embodiment of a cross section of the encased electronic component package sub-assembly of FIG. 15B further in the processing cycle in accordance with the principles of the present invention.

FIG. 15C is a cross-sectional view of an assembly 1500C in accordance with another embodiment of the present invention. Assembly 1500C of FIG. 15C is similar to assembly 1500B of FIG. 15B and only the significant differences are discussed below. Referring now to FIG. 15C, a plurality of first via apertures 1522 and first trace trenches 1523 are formed in a first dielectric layer first surface 1507 of first dielectric layer 1508 by methods similar to those discussed above. In one embodiment of the invention, first via apertures 1522 and first trace trenches 1523 are formed using a laser, i.e., using laser ablation.

Figure 15D:
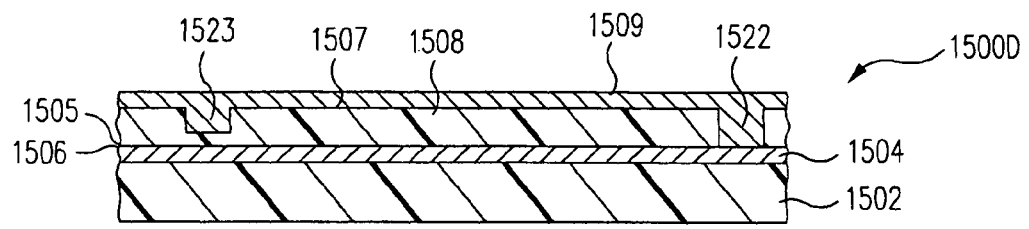
FIG. 15D shows one embodiment of a cross section of the encased electronic component package sub-assembly of FIG. 15C further in the processing cycle in accordance with the principles of the present invention.

FIG. 15D is a cross-sectional view of assembly 1500D in accordance with one embodiment of the present invention. Assembly 1500D of FIG. 15D is similar to assembly 1500C of FIG. 15C and only the significant differences are discussed below. Referring now to FIG. 15D first dielectric layer first surface 1507 is covered with a first conductive layer 1509. In one embodiment of the invention, first conductive layer 1509 is metal or metal containing material, an electrically conductive adhesive such as a silver filled adhesive or polymer, or solder paste. First conductive layer 1509 is applied in order to fill first via apertures 1522 and first trace trenches 1523 with the electrically conductive material. In one embodiment, copper or a copper containing material is plated in first via apertures 1522 and first trace trenches 1523. In another embodiment, first via apertures 1522 and first trace trenches 1523 are filled with an electrically conductive adhesive, which is then cured if necessary. In yet another embodiment, first via apertures 1522 and first trace trenches 1523 are filled with a solder paste and assembly 1500D is then heated to reflow the solder paste.

Figure 15E:
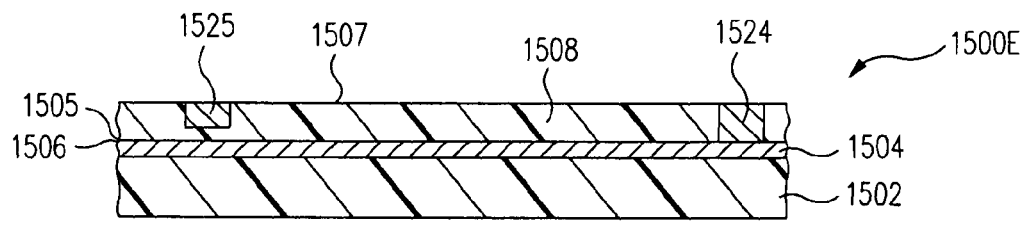
FIG. 15E shows one embodiment of a cross section of the encased electronic component package sub-assembly of FIG. 15D further in the processing cycle in accordance with the principles of the present invention.

FIG. 15E is a cross-sectional view of assembly 1500E in accordance with one embodiment of the present invention. Assembly 1500E of FIG. 15E is similar to assembly 1500D of FIG. 15D and only the significant differences are discussed below. Referring now to FIG. 15E, any excess material of first conductive layer 1509 is removed and made at least level/planar with first dielectric layer first surface 1507 to thereby form first electrically conductive vias 1524 and first traces 1525 from first via apertures 1522 and first trace trenches 1523. In one embodiment, an over-etch process is used to slightly over-etch first electrically conductive vias 1524 and first traces 1525. This ensures that shorting between vias from excess electrically conductive material is avoided.

Figure 15F:
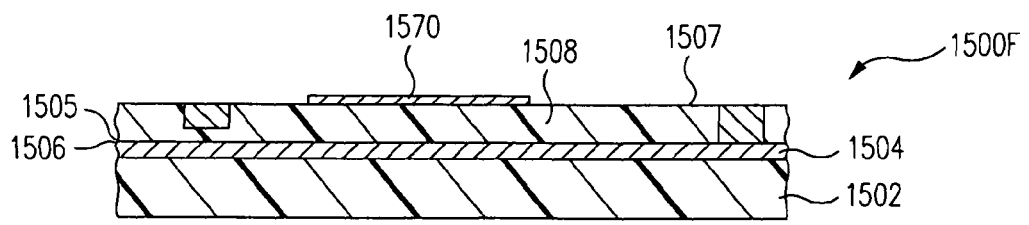
FIG. 15F shows one embodiment of a cross section of the encased electronic component package sub-assembly of FIG. 15E further in the processing cycle in accordance with the principles of the present invention.

FIG. 15F is a cross-sectional view of assembly 1500F in accordance with one embodiment of the present invention. Assembly 1500F of FIG. 15F is similar to assembly 1500E of FIG. 15E and only the significant differences are discussed below. Referring now to FIG. 15F, a die attachment area 1570 is formed on first dielectric layer first surface 1507. In one embodiment of the invention, die attachment area 1570 is copper, or other suitable metal, which is screened onto, sprayed onto, or otherwise applied to dielectric layer first surface 1507. In one embodiment of the invention, die attachment area 1570 also includes a passivation layer and/or an adhesive layer (not shown). In one embodiment of the invention, die attachment area 1570 is marked with one or more fiducials (not shown).

Figure 15G:
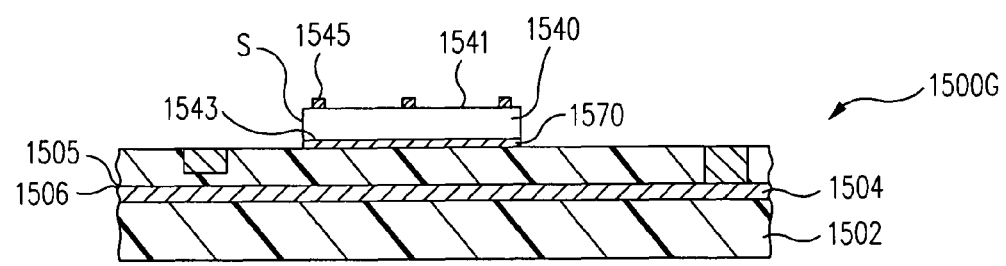
FIG. 15G shows one embodiment of a cross section of the encased electronic component package sub-assembly of FIG. 15F further in the processing cycle in accordance with the principles of the present invention.

FIG. 15G is a cross-sectional view of assembly 1500F in accordance with one embodiment of the present invention. Assembly 1500G of FIG. 15G is similar to assembly 1500F of FIG. 15F and only the significant differences are discussed below. Referring now to FIG. 15G, an electronic component 1540 is positioned on die attach area 1570 with an electronic component second surface 1543 mounted/attached to die attach area 1570. In one embodiment of the invention, electronic component second surface 1543 of electronic component 1540 is mounted in die attach area 1570 with adhesives (not shown), e.g., liquid adhesives or double-sided sticky tapes, although other adhesives are used in other embodiments. As discussed above, formed on first surface 1541 of electronic component 1540 are bond pads 1545, e.g., formed of aluminum. Bond pads 1545 are connected to the internal circuitry of electronic component 1540. In one embodiment, bond pads 1545 are distributed in an array on electronic component first surface 1541. In another embodiment, bond pads 1545 are formed on electronic component first surface 1541 directly adjacent side S of electronic component 1540 in a typical wirebond configuration pattern.

Figure 15H:
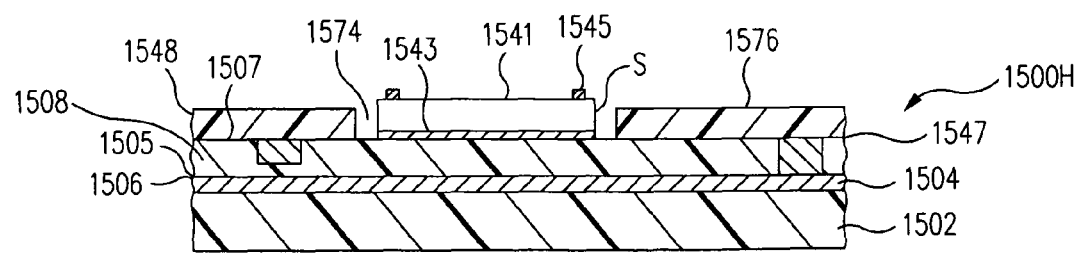
FIG. 15H shows one embodiment of a cross section of the encased electronic component package sub-assembly of FIG. 15G further in the processing cycle in accordance with the principles of the present invention.

FIG. 15H is a cross-sectional view of assembly 1500H in accordance with one embodiment of the present invention. Assembly 1500H of FIG. 15H is similar to assembly 1500G of FIG. 15G and only the significant differences are discussed below. Referring now to FIG. 15H, a second dielectric layer, strip, or panel, 1548, herein referred to collectively as second dielectric layer 1548, is applied to first dielectric layer 1508. More particularly, a second dielectric layer second surface 1547 is mounted to first dielectric layer first surface 1507. In one embodiment, second dielectric layer second surface 1547 is applied to first dielectric layer first surface 1507 using a tack cure. More particularly, second dielectric layer second surface 1547 is pressed on to first dielectric layer first surface 1507. In one embodiment, second dielectric layer second surface 1547 is applied to first dielectric layer first surface 1507 by screen coating. In one embodiment, second dielectric layer second surface 1547 is applied to first dielectric layer first surface 1507 by curtain coating. In other embodiments of the invention, any other method of dielectric application is used to apply second dielectric layer 1548.

Figure 15I:
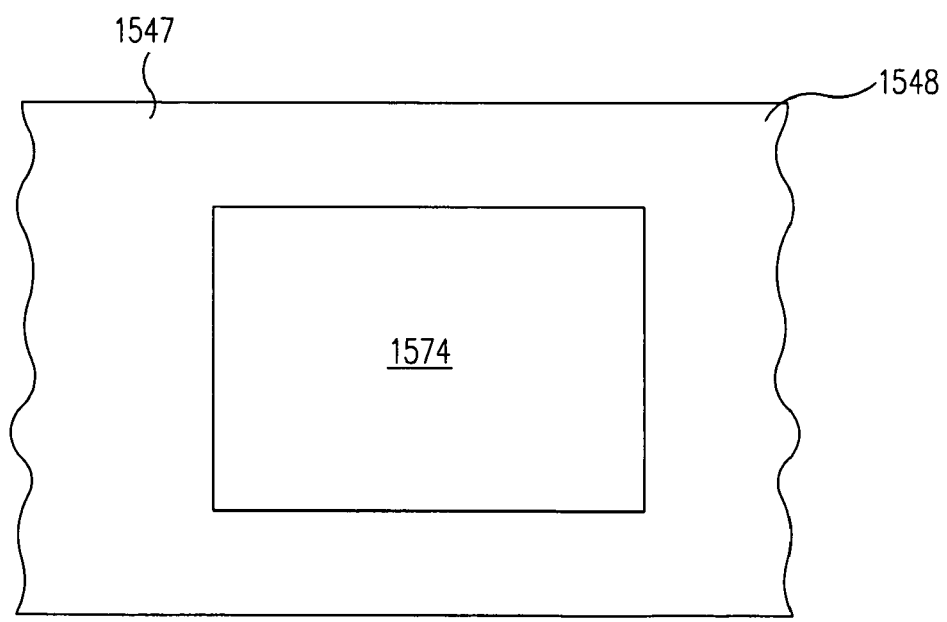
FIG. 15I shows an overhead view of a pre-punched dielectric layer as used in one embodiment of the structure of FIG. 15H in accordance with the principles of the present invention.

In one embodiment of the invention, second dielectric layer 1548 includes pre-punched die holes 1574 that are at least as long, and at least as wide as, electronic component 1540 so that electronic component 1540 sits within die hole 1574. FIG. 15I shows an overhead view of a singulated portion of a second dielectric layer 1548 including second dielectric layer second surface 1547, and die hole 1574 prior to application of second dielectric layer second surface 1547 to first dielectric layer first surface 1507.

Figure 15J:
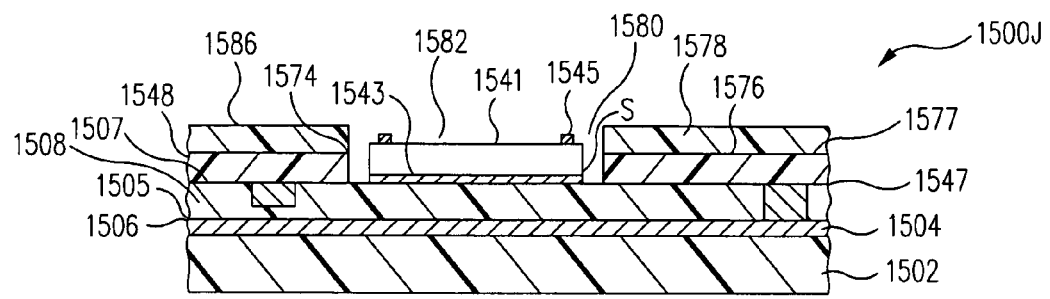
FIG. 15J shows one embodiment of a cross section of the encased electronic component package sub-assembly of FIG. 15H further in the processing cycle in accordance with the principles of the present invention.

FIG. 15J is a cross-sectional view of assembly 1500J in accordance with one embodiment of the present invention. Assembly 1500J of FIG. 15J is similar to assembly 1500H of FIG. 15H and only the significant differences are discussed below. Referring now to FIG. 15J, a third dielectric layer, strip, or panel, 1578, herein referred to collectively as third dielectric layer 1578, is applied to second dielectric layer 1548. More particularly, a third dielectric layer second surface 1577 is mounted to second dielectric layer first surface 1576. In one embodiment, third dielectric layer second surface 1577 is applied to second dielectric layer first surface 1576 using a tack cure. More particularly, third dielectric layer second surface 1577 is pressed onto second dielectric layer first surface 1576. In one embodiment, third dielectric layer second surface 1577 is applied to second dielectric layer first surface 1576 by screen coating. In one embodiment, third dielectric layer second surface 1577 is applied to second dielectric layer first surface 1576 by curtain coating. In other embodiments of the invention, any other method of dielectric application is used to apply third dielectric layer 1578.

In one embodiment of the invention, third dielectric layer 1578, like second dielectric layer 1548 includes pre-punched die holes 1580 that are at least as long and at least as wide as electronic component 1540 so that electronic component 1540 sits within die hole 1580. As seen in FIG. 15J, with the application of third dielectric layer 1578 to second dielectric layer 1548, a cavity 1582 is formed around electronic component 1540 such that electronic component 1540 sits within cavity 1582 with first surface 1541 below a first surface 1586 of third dielectric layer 1578. Those of skill in the art will readily recognize that while two additional layers of dielectric material were discussed above to form cavity 1582, in other embodiments of the invention one, three or any number of layers of dielectric material may be used and/or required to form cavity 1582, depending on the needs of the designer and the height of the electronic component used. Consequently, using the method of this embodiment of the invention, considerable design and material flexibility is provided.

Figure 15K:
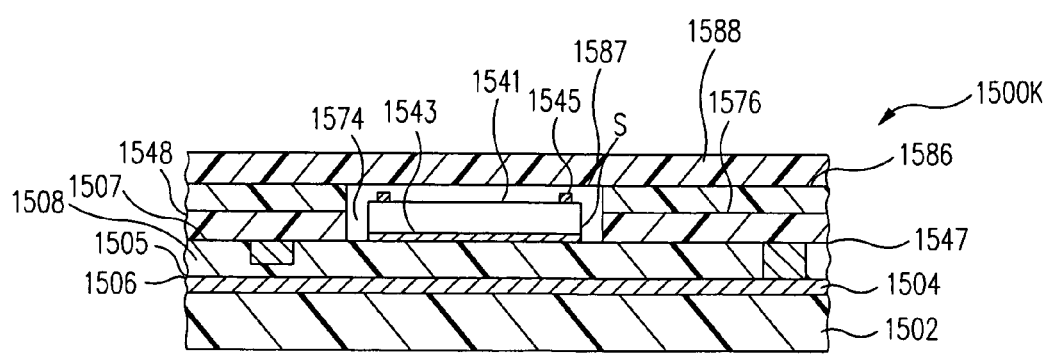
FIG. 15K shows one embodiment of a cross section of the encased electronic component package sub-assembly of FIG. 15J further in the processing cycle in accordance with the principles of the present invention.

FIG. 15K is a cross-sectional view of assembly 1500K in accordance with one embodiment of the present invention. Assembly 1500K of FIG. 15K is similar to assembly 1500) of FIG. 15J and only the significant differences are discussed below. Referring now to FIG. 15K, a fourth dielectric layer, strip, or panel, 1588, herein referred to collectively as fourth dielectric layer 1588, is applied to third dielectric layer 1578. More particularly, a fourth dielectric layer second surface 1587 is mounted to third dielectric layer first surface 1586. In one embodiment, fourth dielectric layer second surface 1587 is applied to third dielectric layer first surface 1586 using a tack cure. More particularly, fourth dielectric layer second surface 1587 is pressed on to third dielectric layer first surface 1586. In one embodiment, fourth dielectric layer second surface 1587 is applied to third dielectric layer first surface 1586 by screen coating. In one embodiment, fourth dielectric layer second surface 1587 is applied to third dielectric layer first surface 1586 by curtain coating. In other embodiments of the invention, any other method of dielectric application is used to apply fourth dielectric layer 1588.

As seen in FIG. 15K, in one embodiment of the invention, fourth dielectric layer 1588 does not include any holes and the application of fourth dielectric layer 1588 results in electronic component 1540 being encased in dielectric material within cavity 1582 with sides S of electronic component 1540 and first surface 1541 of electronic component 1540 surrounded by dielectric material.

In one embodiment of the invention, second, third and fourth dielectric layers 1548, 1578 and 1588 are made of a re-flowable resin material, such as prepreg, so that when heat, or another catalyst is applied to the structure formed by second, third and fourth dielectric layers 1548, 1578 and 1588, the structure re-flows to encase electronic component 1540 in a more or less custom fit.

Figure 15L:
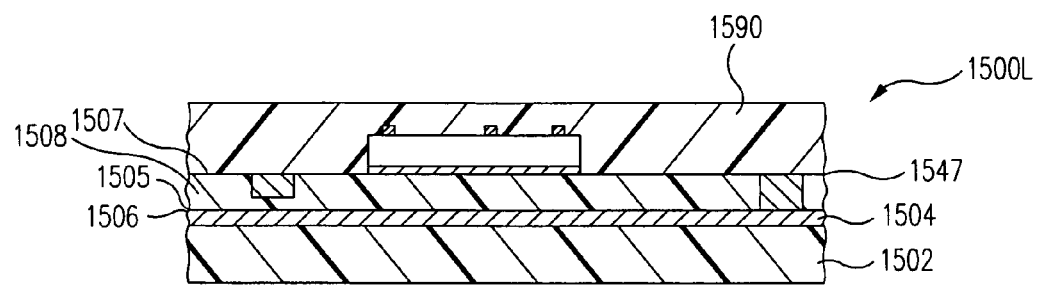
FIG. 15L shows one embodiment of a cross section of an encased electronic component package sub-assembly in accordance with the principles of the present invention.

FIG. 15L is a cross-sectional view of assembly 1500L in accordance with one embodiment of the present invention. Assembly 1500L of FIG. 15L is similar to assembly 1500K of FIG. 15K and only the significant differences are discussed below. Referring now to FIG. 15L, the assembly is shown after second, third and fourth dielectric layers 1548, 1578 and 1588 are re-flowed by heat, or another catalyst, to encase electronic component 1540 in encasement 1590 of dielectric material.

Of note is the fact that in the embodiment of the invention shown in FIG. 15L no gap portions, such as gap portions 1450 between electronic component 1440 sides S and cavity 1430 walls W of FIG. 14H discussed above, remain or are an issue.

Figure 15M:
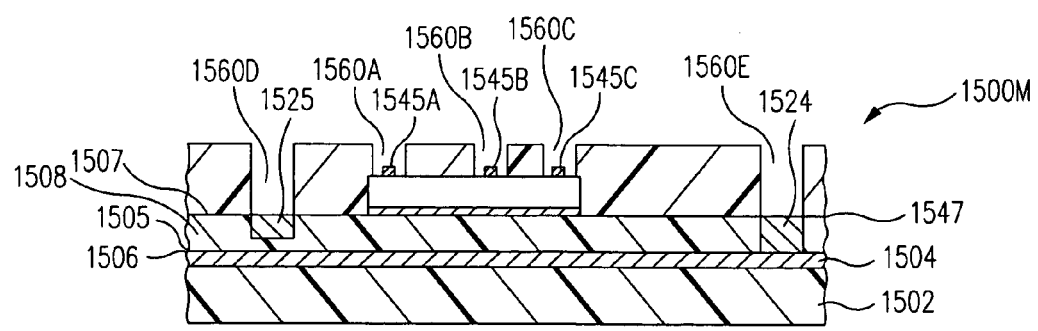
FIG. 15M shows one embodiment of a cross section of an encased electronic component package sub-assembly in accordance with the principles of the present invention.

FIG. 15M is a cross-sectional view of an assembly 1500M in accordance with one embodiment of the present invention. Assembly 1500M of FIG. 15M is similar to assembly 1500L of FIG. 15L and only the significant differences are discussed below. Referring now to FIG. 15M, a plurality of second via apertures 1560A, 1560B, 1560C, 1560D and 1560E are formed using a laser, i.e., using laser ablation. Second via apertures 1560A, 1560B, 1560C, 1560D and 1560E extend through encasement 1590 to selected ones of bond pads 1545A, 1545B, 1545C of electronic component 1540 and selected ones of first electrically conductive vias 1524 and first electrically conductive traces 1525. In one embodiment, second via apertures 1560A, 1560B, 1560C, 1560D and 1560E are cylindrical in shape, however, other shapes are used in other embodiments. Bond pads 1545A, 1545B, 1545C of electronic component 1540 and first electrically conductive vias 1524 and first electrically conductive traces 1525 are exposed through second via apertures 1560A, 1560B, 1560C, 1560D and 1560E. In one embodiment, the laser intensity is set to be sufficient to remove portions of encasement 1590. However, the laser intensity is set to be insufficient to remove bond pads 1545A, 1545B, 1545C. Accordingly, pulsing of the laser forms a single second via aperture 1560A, 1560B, 1560C, 1560D or 1560E extending through encasement 1590 to one of bond pads 1545A, 1545B, or 1545C of electronic component 1540. The laser is then stepped to the next location to form the next second via aperture 1560A, 1560B, 1560C, 1560D or 1560E. To illustrate, electronic component 1540 includes bond pads 1545A, 1545B, 1545C on first surface of electronic component 1540. Second via aperture 1560A, 1560B, 1560C of the plurality of second via aperture 1560A, 1560B, 1560C, 1560D and 1560E extend through encasement 1590 to bond pads 1545A, 1545B, 1545C, respectively. In addition, second via aperture 1560E and 1560D of the plurality of second via aperture 1560A, 1560B, 1560C, 1560D and 1560E extend through encasement 1590 to first electrically conductive vias 1524 and first electrically conductive traces 1525, respectively. To further illustrate, initially, the laser is pulsed to form second via aperture 1560A. The laser is then stepped and pulsed again to form second via aperture 1560B. The laser is then stepped and pulsed again to form second via aperture 1560C. The laser is stepped and pulsed repeatedly until all of second via aperture 1560A, 1560B, 1560C, 1560D and 1560E are formed. However, in another embodiment, a plurality of lasers are simultaneous pulsed to form some or all of second via aperture 1560A, 1560B, 1560C, 1560D and 1560E simultaneously. In yet other embodiments, second via aperture 1560A, 1560B, 1560C, 1560D and 1560E are formed using selective etching, mechanical drilling, or other techniques.

Figure 15N:
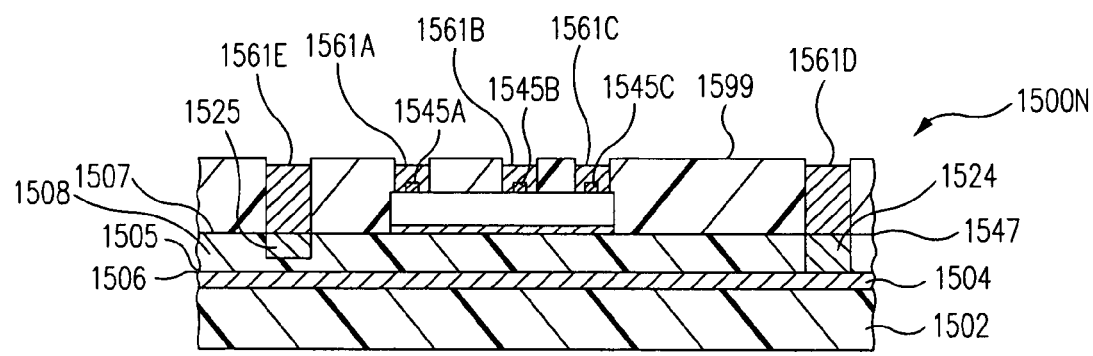
FIG. 15N shows one embodiment of a cross section of an encased electronic component package sub-assembly in accordance with the principles of the present invention.

FIG. 15N is a cross-sectional view of an assembly 1500N in accordance with one embodiment of the present invention. Assembly 1500N of FIG. 15N is similar to assembly 1500M of FIG. 15M and only the significant differences are discussed below. Referring now to FIGS. 15M and 15N together, second via apertures 1560A, 1560B, 1560C, 1560D and 1560E are filled with an electrically conductive material, e.g., a metal or metal containing material, an electrically conductive adhesive such as a silver filled adhesive or polymer, or solder paste, to form second electrically conductive vias 1561A, 1561B, 1561C, 1561D, and 1561E.

In one embodiment, copper or a copper containing material is plated in second via apertures 1560A, 1560B, 1560C, 1560D and 1560E to form second electrically conductive vias 1561A, 1561B, 1561C, 1561D, and 1561E. In another embodiment, second via apertures 1560A, 1560B, 1560C, 1560D and 1560E are filled with an electrically conductive adhesive, which is then cured, if necessary, to form second electrically conductive vias 1561A, 1561B, 1561C, 1561D, and 1561E. In yet another embodiment, second via apertures 1560A, 1560B, 1560C, 1560D and 1560E are filled with a solder paste. Assembly 1500L is then heated to reflow the solder paste to form second electrically conductive vias 1561A, 1561B, 1561C, 1561D, and 1561E. After formation of second electrically conductive vias 1561A, 1561B, 1561C, 1561D, and 1561E, any excess electrically conductive material formed on encasement first surface 1599 is removed. Illustratively, an etch or physical grinding process is used. In one embodiment, an over-etch process is used to slightly over-etch second electrically conductive vias 1561A, 1561B, 1561C, 1561D, and 1561E. Thus, second electrically conductive vias 1561A, 1561B, 1561C, 1561D, and 1561E remain recessed within second via apertures 1560A, 1560B, 1560C, 1560D and 1560E. This ensures that shorting between second electrically conductive vias 1561A, 1561B, 1561C, 1561D, and 1561E from excess electrically conductive material is avoided.

Second electrically conductive vias 1561A, 1561B, 1561C, 1561D, and 1561E are electrically connected to corresponding bond pads 1545A, 1545B, 1545C of electronic component 1540 and first electrically conductive vias 1524 and first electrically conductive traces 1525. To illustrate, second electrically conductive vias 1561A, 1561B, 1561C of the plurality of second electrically conductive vias 1561A, 15613, 1561C are electrically connected to bond pads 1545A, 1545B, 1545C of electronic component 1540, respectively. Consequently, second electrically conductive vias 1561A, 1561B, 1561C extend from bond pads 1545A, 1545B, 1545C, through encasement 1590, to be adjacent or slightly recessed from encasement first surface 1599. Likewise, second electrically conductive vias 1561D, 1561E are electrically connected to first electrically conductive vias 1524 and first electrically conductive traces 1525. Consequently, second electrically conductive vias 1561D, 1561E extend from first electrically conductive vias 1524 and first electrically conductive traces 1525, through encasement 1590, to be adjacent or slightly recessed from encasement first surface 1599. Stated another way, bond pads 1545A, 1545B, 1545C of electronic component 1540 and first electrically conductive vias 1524 and first electrically conductive traces 1525 are electrically connected to corresponding second electrically conductive vias 1561A, 1561B, 1561C, 1561D, and 1561E, and encasement first surface 1599, without the use of a solder, e.g., without the use of flip chip bumps, and without the need to form a solder wetting layer, e.g., a nickel/gold layer, on bond pads 1545A, 1545B, 1545C. This maximizes the reliability of the electrical connection between second electrically conductive vias 1561A, 1561B, 1561C, 1561D, and 1561E and bond pads 1545A, 1545B, 1545C of electronic component 1540 and first electrically conductive vias 1524 and first electrically conductive traces 1525, while at the same time minimizing impedance.

After formation of second electrically conductive vias 1561A, 1561B, 1561C, 1561D, and 1561E, assembly 1500N is inspected, e.g., optically using an automatic inspection system, to insure that all second via apertures 1560A, 1560B, 1560C, 1560D and 1560E are properly filled with electrically conductive material, i.e., to inspect the integrity of second electrically conductive vias 1561A, 1561B, 1561C, 1561D, and 1561E. In one embodiment, any defective or unformed second electrically conductive vias 1561A, 1561B, 1561C, 1561D, and 1561E detected during the inspection are corrected, e.g., by etch removal of second electrically conductive vias 1561A, 1561B, 1561C, 1561D, and 1561E, reapplication of the electrically conductive material to reform second electrically conductive vias 1561A, 1561B, 1561C, 1561D, and 1561E, e.g., re-plating, and removal of any excess electrically conductive material.

In this manner, the encased electronic component packages are fabricated with a maximum yield, e.g., essentially a 100 percent yield. This further minimizes the fabrication cost of the wafer level electronic component packages.

This disclosure provides exemplary embodiments of the present invention. The scope of the present invention is not limited by these exemplary embodiments. Numerous variations, whether explicitly provided for by the specification or implied by the specification or not, such as variations in structure, dimension, type of material and manufacturing process may be implemented by one of skill in the art in view of this disclosure.

What is claimed is:

1. A method of forming an embedded electronic component package comprising:
    providing a substrate, the substrate having a substrate first surface and a substrate second surface, opposite the substrate first surface;
    providing a first dielectric layer, the first dielectric layer having a first dielectric layer first surface and a first dielectric layer second surface, opposite the first dielectric layer first surface;
    applying the first dielectric layer second surface to the substrate first surface;
    forming a cavity in the first dielectric layer first surface, the cavity having a bottom surface at a predetermined depth below the first dielectric layer first surface;
    providing an electronic component, the electronic component having an electronic component first surface and an electronic component second surface, opposite the electronic component first surface, a plurality of bond pads being formed on the electronic component;
    attaching the electronic component second surface to the cavity bottom surface;
    providing a second dielectric layer, the second dielectric layer having a second dielectric layer first surface and a second dielectric layer second surface, opposite the second dielectric layer first surface;
    applying the second dielectric layer second surface to the first dielectric layer first surface such that the electronic component first surface is covered by the second dielectric layer;
    forming via apertures through the second dielectric layer to expose selected bond pads of the plurality of bond pads on the electronic component;
    filling the via apertures with an electrically conductive material to form electrically conductive vias electrically coupled to the selected bond pads of the plurality of bond pads on the electronic component;
    inspecting the integrity of the electrically conductive vias;
    when the electrically conductive vias comprise defective electrically conductive vias, removing the electrically conductive vias; and
    reapplying the electrically conductive material in the via apertures to reform the electrically conductive vias.

2. The method of claim 1 wherein excess electrically conductive material is formed on the second dielectric layer first surface when filling the via apertures with the electrically conductive material to form the electrically conductive vias, the method further comprising removing the excess electrically conductive material from the second dielectric layer first surface.

3. The method of claim 2 wherein the removing the excess electrically conductive material from the second dielectric layer first surface is performed using an etch process.

4. The method of claim 1 wherein the electrically conductive vias extend from the bond pads through the second dielectric layer to be recessed from the second dielectric layer first surface.

5. The method of claim 1 wherein the substrate is a motherboard.

6. The method of claim 1 wherein the first dielectric layer is a strip or panel of dielectric material.

7. A method of forming an embedded electronic component package comprising:
    providing a substrate, the substrate having a substrate first surface and a substrate second surface, opposite the substrate first surface;
    providing a first dielectric layer, the first dielectric layer having a first dielectric layer first surface and a first dielectric layer second surface, opposite the first dielectric layer first surface;
    applying the first dielectric layer second surface to the substrate first surface;
    forming first via apertures and first trace trenches in the first dielectric layer first surface;
    filling the first via apertures and first trace trenches with an electrically conductive material to form first electrically conductive vias and first electrically conductive traces electrically coupled to selected locations on the substrate first surface;
    forming a cavity in the first dielectric layer first surface, the cavity having a bottom surface at a predetermined depth below the first dielectric layer first surface;
    providing an electronic component, the electronic component having an electronic component first surface and an electronic component second surface, opposite the electronic component first surface, a plurality of bond pads being formed on the electronic component;
    attaching the electronic component second surface to the cavity bottom surface;
    providing a second dielectric layer, the second dielectric layer having a second dielectric layer first surface and a second dielectric layer second surface, opposite the second dielectric layer first surface;
    applying the second dielectric layer second surface to the first dielectric layer first surface such that the electronic component first surface is covered by the second dielectric layer;
    forming second via apertures through the second dielectric layer to expose selected bond pads of the plurality of bond pads on the electronic component, selected first electrically conductive vias, and selected first electrically conductive traces;

filling the second via apertures with an electrically conductive material to form second electrically conductive vias electrically coupled to the selected bond pads of the plurality of bond pads on the electronic component, the selected first electrically conductive vias, and the selected first electrically conductive traces;

inspecting the integrity of the first electrically conductive vias;

when the first electrically conductive vias comprise defective first electrically conductive vias, removing the first electrically conductive vias; and reapplying the electrically conductive material in the first via apertures to reform the first electrically conductive vias.

8. The method of claim 7 wherein excess electrically conductive material is formed on the first dielectric layer first surface when filling the first via apertures and first trace trenches with the electrically conductive material, the method further comprising removing the excess electrically conductive material from the first dielectric layer first surface of the first dielectric layer.

9. The method of claim 8 wherein the removing the excess electrically conductive material from the first dielectric layer first surface is performed using an etch process.

10. The method of claim 7 wherein excess electrically conductive material is formed on the second dielectric layer first surface of the second dielectric layer when filling the second via apertures with the electrically conductive material to form the second electrically conductive vias, the method further comprising removing the excess electrically conductive material from the second dielectric layer first surface.

11. The method of claim 10 wherein the removing the excess electrically conductive material from the second dielectric layer first surface of the second dielectric layer is performed using an etch process.

12. The method of claim 7 wherein the first electrically conductive vias extend from the substrate first surface through the first dielectric layer to be recessed from the first dielectric layer first surface.

13. The method of claim 7 wherein the second electrically conductive vias extend from the bond pads through the second dielectric layer to be recessed from the second dielectric layer first surface.

14. The method of claim 7 wherein the substrate is a motherboard.

15. The method of claim 7 wherein the first dielectric layer and the second dielectric layer comprise a strip or panel of dielectric material.

16. A method of forming an embedded electronic component package comprising:
providing a substrate, the substrate having a substrate first surface and a substrate second surface, opposite the substrate first surface;
providing a first dielectric layer, the first dielectric layer having a first dielectric layer first surface and a first dielectric layer second surface, opposite the first dielectric layer first surface;
applying the first dielectric layer second surface to the substrate first surface;
forming first via apertures and first trace trenches in the first dielectric layer first surface;
filling the first via apertures and first trace trenches with an electrically conductive material to form first electrically conductive vias and first electrically conductive traces electrically coupled to selected locations on the substrate first surface;

forming a cavity in the first dielectric layer first surface, the cavity having a bottom surface at a predetermined depth below the first dielectric layer first surface;
providing an electronic component, the electronic component having an electronic component first surface and an electronic component second surface, opposite the electronic component first surface, a plurality of bond pads being formed on the electronic component;
attaching the electronic component second surface to the cavity bottom surface;
providing a second dielectric layer, the second dielectric layer having a second dielectric layer first surface and a second dielectric layer second surface, opposite the second dielectric layer first surface;
applying the second dielectric layer second surface to the first dielectric layer first surface such that the electronic component first surface is covered by the second dielectric layer;
forming second via apertures through the second dielectric layer to expose selected bond pads of the plurality of bond pads on the electronic component, selected first electrically conductive vias, and selected first electrically conductive traces;
filling the second via apertures with an electrically conductive material to form second electrically conductive vias electrically coupled to the selected bond pads of the plurality of bond pads on the electronic component, the selected first electrically conductive vias, and the selected first electrically conductive traces;
inspecting the integrity of the second electrically conductive vias;
when the second electrically conductive vias comprise defective second electrically conductive vias, removing the second electrically conductive vias; and
reapplying the electrically conductive material in the second via apertures to reform the second electrically conductive vias.

17. A method of forming an embedded electronic component package comprising:
applying a first dielectric layer to a substrate;
forming a cavity in the first dielectric layer;
attaching an electronic component to a bottom surface of the cavity;
applying a second dielectric layer to the first dielectric layer and to the electronic component such that the electronic component is covered by the second dielectric layer;
forming via apertures through the second dielectric layer to expose bond pads of the electronic component;
filling the via apertures with an electrically conductive material to form electrically conductive vias electrically coupled to the bond pads of the electronic component;
inspecting the integrity of the electrically conductive vias;
when the electrically conductive vias comprise defective electrically conductive vias, removing the electrically conductive vias; and
reapplying the electrically conductive material in the via apertures to reform the electrically conductive vias.

18. The method of claim 17 further comprising:
forming first via apertures and first trace trenches in the first dielectric layer; and
filling the first via apertures and first trace trenches with an electrically conductive material to form first electrically conductive vias and first electrically conductive traces.

* * * * *